US012690449B2

(12) United States Patent
Luo

(10) Patent No.: US 12,690,449 B2
(45) Date of Patent: Jul. 21, 2026

(54) MEMORY DEVICE INCLUDING SOURCE STRUCTURE HAVING CONDUCTIVE ISLANDS OF DIFFERENT WIDTHS

(71) Applicant: Micron Technology, Inc., Boise, ID (US)

(72) Inventor: Shuangqiang Luo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 516 days.

(21) Appl. No.: 18/202,061

(22) Filed: May 25, 2023

(65) Prior Publication Data

US 2023/0395501 A1 Dec. 7, 2023

Related U.S. Application Data

(60) Provisional application No. 63/347,644, filed on Jun. 1, 2022.

(51) Int. Cl.
| | |
|---|---|
| *H10W 20/41* | (2026.01) |
| *G11C 16/04* | (2006.01) |
| *H10B 41/10* | (2023.01) |
| *H10B 41/27* | (2023.01) |
| *H10B 41/35* | (2023.01) |

(52) U.S. Cl.
CPC ....... *H10W 20/435* (2026.01); *G11C 16/0483* (2013.01); *H10B 41/10* (2023.02); *H10B 41/27* (2023.02); *H10B 41/35* (2023.02)

(58) Field of Classification Search
CPC . H01L 23/5283; G11C 16/0483; H10B 41/10; H10B 41/27; H10B 41/35; H10B 43/10; H10B 43/27
See application file for complete search history.

(56) References Cited

U.S. PATENT DOCUMENTS

| | | | | | |
|---|---|---|---|---|---|
| 2018/0138195 | A1* | 5/2018 | Lee | ...................... | H10D 62/292 |
| 2021/0399005 | A1* | 12/2021 | Lee | ................... | H01L 21/76805 |
| 2022/0189988 | A1* | 6/2022 | Kang | ................. | H01L 23/5283 |

* cited by examiner

*Primary Examiner* — Sitaramarao S Yechuri
(74) *Attorney, Agent, or Firm* — Schwegman Lundberg & Woessner, P.A.

(57) ABSTRACT

Some embodiments include apparatuses. One of the apparatuses includes a conductive structure including a first conductive region under first memory cells, a second conductive region under second memory cells, and a third conductive region between the first and second conductive regions; conductive islands adjacent each other and formed in the third conductive region and separated from the third conductive region; dielectric isolators separating the conductive islands from each other, wherein the conductive islands include a conductive island such that a first portion of the conductive islands is located on a first side of the conductive island, and a second portion of the conductive islands is located on a second side of the conductive island; and the width of the conductive island is greater than the width of at least one conductive island in each of the first and second portions of the conductive islands.

21 Claims, 12 Drawing Sheets

200

200

200

200

400

500

MEMORY DEVICE INCLUDING SOURCE STRUCTURE HAVING CONDUCTIVE ISLANDS OF DIFFERENT WIDTHS

PRIORITY APPLICATION

This application claims the benefit of priority to U.S. Provisional Application Ser. No. 63/347,644, filed Jun. 1, 2022, which is incorporated herein by reference in its entirety.

FIELD

Embodiments described herein relate to memory devices including connections between conductive structures of a source region and vertical conductive structures of the memory device.

BACKGROUND

Some conventional memory devices have vertical conductive structures as part of the conductive paths that provide electrical signals between circuit elements of the memory device. The vertical conductive structures are often connected to the circuit elements through conductive pads, which are also part of the conductive paths. The conductive pads often have size enough for the vertical conductive structures to land on and form electrical connections with the conductive pads. During the process of forming the connections between the vertical conductive structures and the conductive pads, some of the vertical conductive structures may fail to completely land on respective conductive pads. This can result in poor electrical connections between circuit elements, leading to reduced device reliability and performance.

DETAILED DESCRIPTION

The techniques described herein involve a memory device having conductive islands (e.g., conductive pads) for electrical connections with vertical contact structures (vertical conductive pillars). The conductive islands can be part of a conductive structure of a source region located under memory cells of the memory device. The conductive islands are adjacent each other and separated from each other by dielectric isolators. The contact structures are formed on the conductive islands and are part of conductive paths between data lines and circuitry formed under the conductive islands. During the process of forming the connections between the contact structures and the conductive islands, some of the contact structures may fall off respective conductive islands. A falloff occurs when a contact structure (vertical conductive pillar) fails to completely land on a respective conductive island. Such a falloff can lead to poor electrical connections between circuit elements. This can result in reduced device reliability and performance. As described in more detail below, the described conductive islands and dielectric isolators can be structured such that a falloff may be avoided. Thus, reliability and performance of the device can be improved. Other improvements and benefits of the described techniques are further discussed below with reference to FIG. 1 through FIG. 5.

Figure 1:
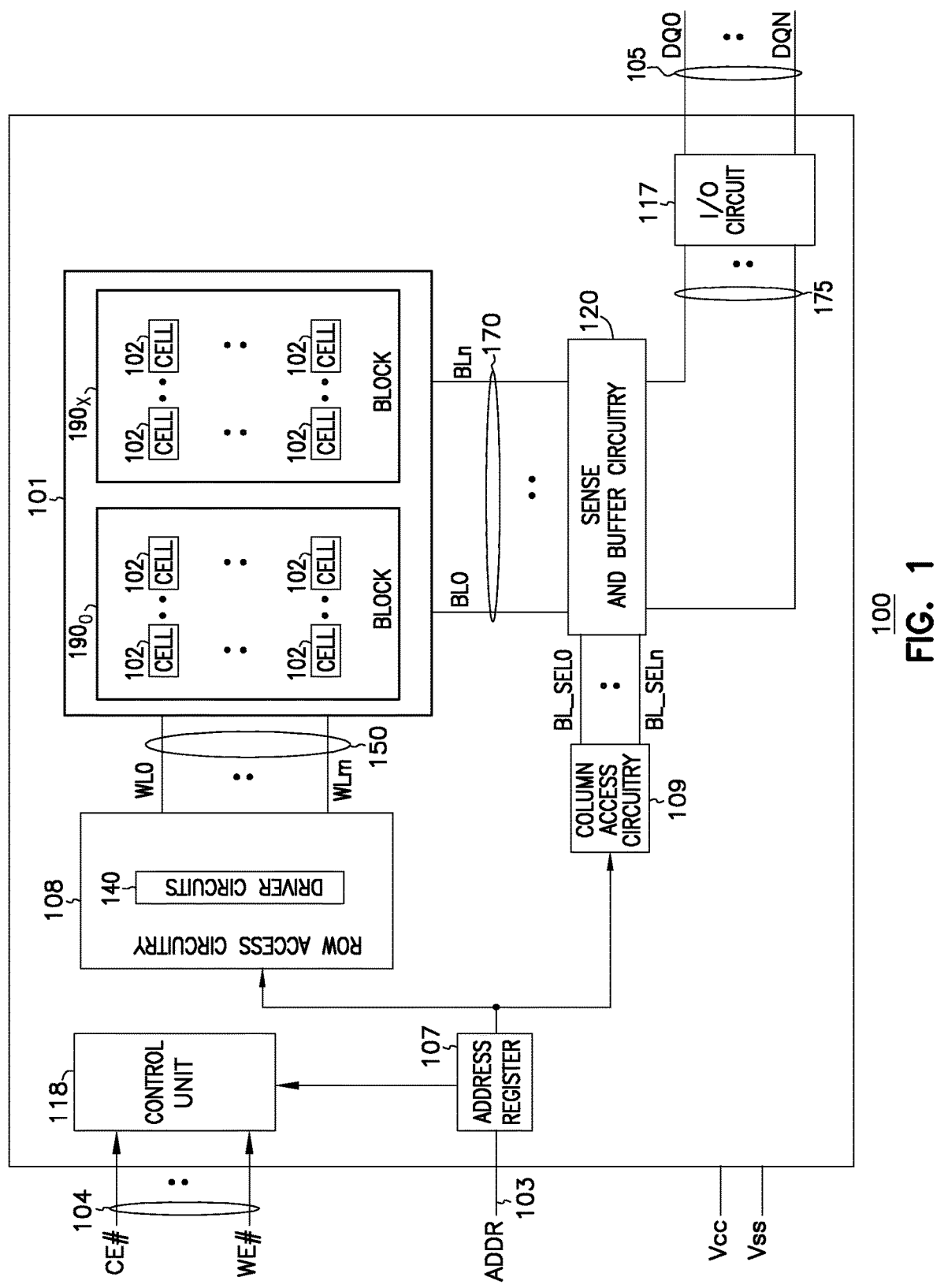
FIG. 1 shows an apparatus in the form of a memory device, according to some embodiments described herein.

FIG. 1 shows an apparatus in the form of a memory device 100, according to some embodiments described herein. Memory device 100 can include a memory array (or multiple memory arrays) 101 containing memory cells 102 arranged in blocks (blocks of memory cells), such as blocks 190₀ through 190ₓ (e.g., there are X+1 blocks in memory device 100). In the physical structure of memory device 100, memory cells 102 can be arranged vertically (e.g., stacked one over another) over a substrate (e.g., a semiconductor substrate) of memory device 100.

As shown in FIG. 1, memory device 100 can include access lines 150 and data lines 170. Access lines 150 can include word lines, which can include global word lines and local word lines (e.g., control gates). Data lines 170 can include bit lines (e.g., local bit lines). Access lines 150 can carry signals (e.g., word line signals) WL0 through WLm. Data lines 170 can carry signals (e.g., bit line signals) BL0 through BLn. Memory device 100 can use access lines 150 to selectively access memory cells 102 of blocks 190₀ through 190ₓ and data lines 170 to selectively exchange information (e.g., data) with memory cells 102.

Memory device 100 can include an address register 107 to receive address information (e.g., address signals) ADDR on lines (e.g., address lines) 103. Memory device 100 can include row access circuitry 108 and column access circuitry 109 that can decode address information from address register 107. Based on decoded address information, memory device 100 can determine which memory cells 102 of which blocks 190₀ through 190ₓ are to be accessed during a memory operation. Memory device 100 can include drivers (driver circuits) 140, which can be part of row access circuitry 108. Drivers 140 can operate (e.g., operate as switches) to form (or not to form) conductive paths (e.g., current paths) between nodes (e.g., global access lines)

providing voltages and respective access lines 150 during operations of memory device 100.

Memory device 100 can perform a read operation to read (e.g., sense) information (e.g., previously stored information) from memory cells 102 of blocks 190₀ through 190ₓ, or a write (e.g., programming) operation to store (e.g., program) information in memory cells 102 of blocks 190₀ through 190ₓ. Memory device 100 can use data lines 170 associated with signals BL0 through BLn to provide information to be stored in memory cells 102 or obtain information read (e.g., sensed) from memory cells 102. Memory device 100 can also perform an erase operation to erase information from some or all of memory cells 102 of blocks 190₀ through 190ₓ.

Memory device 100 can include a control unit 118 that can be configured to control memory operations of memory device 100 based on control signals on lines 104. Examples of the control signals on lines 104 include one or more clock signals and other signals (e.g., a chip-enable signal CE #, a write-enable signal WE #) to indicate which operation (e.g., read, write, or erase operation) memory device 100 can perform. Other devices external to memory device 100 (e.g., a memory controller or a processor) may control the values of the control signals on lines 104. Specific values of a combination of the signals on lines 104 may produce a command (e.g., read, write, or erase command) that may cause memory device 100 to perform a corresponding memory operation (e.g., read, write, or erase operation).

Memory device 100 can include sense and buffer circuitry 120 that can include components such as sense amplifiers and page buffer circuits (e.g., data latches). Sense and buffer circuitry 120 can respond to signals BL_SEL0 through BL_SELn from column access circuitry 109. Sense and buffer circuitry 120 can be configured to determine (e.g., by sensing) the value of information read from memory cells 102 (e.g., during a read operation) of blocks 190₀ through 190ₓ and provide the value of the information to lines 175, which can include global data lines (e.g., global bit lines). Sense and buffer circuitry 120 can also be configured to use signals on lines 175 to determine the value of information to be stored (e.g., programmed) in memory cells 102 of blocks 190₀ and 190ₓ (e.g., during a write operation) based on the values (e.g., voltage values) of signals on lines 175 (e.g., during a write operation).

Memory device 100 can include input/output (I/O) circuitry 117 to exchange information between memory cells 102 of blocks 190₀ through 190ₓ and lines (e.g., I/O lines) 105. Signals DQ0 through DQN on lines 105 can represent information read from or stored in memory cells 102 of blocks 190₀ through 190ₓ. Lines 105 can include nodes within memory device 100 or pins (or solder balls) on a package where memory device 100 can reside. Other devices external to memory device 100 (e.g., a memory controller or a processor) can communicate with memory device 100 through lines 103, 104, and 105.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or alternating current to direct current (AC-DC) converter circuitry.

Each of memory cells 102 can be programmed to store information representing a value of at most one bit (e.g., a single bit), or a value of multiple bits such as two, three, four, or another number of bits. For example, each of memory cells 102 can be programmed to store information representing a binary value "0" or "1" of a single bit. The single bit per cell is sometimes called a single-level cell. In another example, each of memory cells 102 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A cell that can store multiple bits is sometimes called a multi-level cell (or multi-state cell).

Memory device 100 can include a non-volatile memory device, and memory cells 102 can include non-volatile memory cells, such that memory cells 102 can retain information stored thereon when power (e.g., voltage Vcc, Vss, or both) is disconnected from memory device 100. For example, memory device 100 can be a flash memory device, such as a NAND flash (e.g., 3-dimensional (3-D) NAND) or a NOR flash memory device, or another kind of memory device, such as a variable resistance memory device (e.g., a phase change memory device or a resistive Random-Access Memory (RAM) device.

One of ordinary skill in the art may recognize that memory device 100 may include other components, several of which are not shown in FIG. 1 so as not to obscure the example embodiments described herein. At least a portion of memory device 100 can include structures and perform operations similar to or identical to the structures and operations of any of the memory devices described below with reference to FIG. 2 through FIG. 5.

Figure 2:
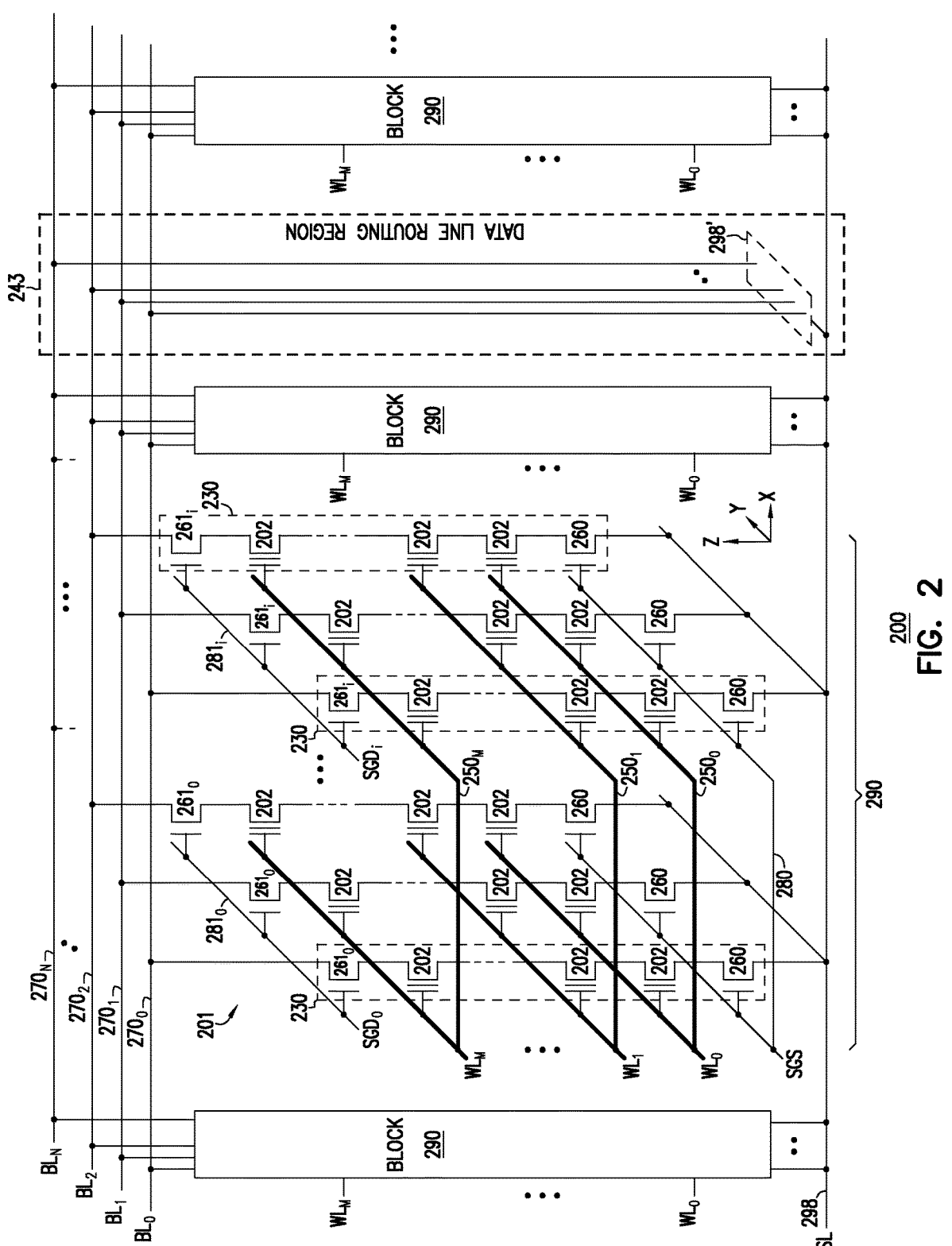
FIG. 2 shows a schematic of a memory device having a memory array and memory cell blocks, according to some embodiments described herein.

FIG. 2 shows a schematic of a memory device 200 having a memory array 201, and blocks (e.g., memory cell blocks) 290, according to some embodiments described herein. For simplicity, only detail for elements of one block 290 is shown in FIG. 2.

Memory device 200 can include a non-volatile (e.g., NAND flash memory device) or other types of memory devices. Memory device 200 can correspond to memory device 100. For example, memory array (or multiple memory arrays) 201 and blocks 290 can correspond to memory array 101 and blocks 190₀ through 190ₓ, respectively, of memory device 100 of FIG. 1.

As shown in FIG. 2, memory device 200 can include memory cells 202, data lines 270₀ through 270ₙ (270₀-270ₙ), and control gates 250₀ through 250ₘ in block 290. Data lines 270₀-270ₙ can correspond to part of data lines 170 of memory device 100 of FIG. 1. In FIG. 2, the label "N" (index N) next to a number (e.g., 270ₙ) represents the number of data lines of memory device 200. For example, if memory device 200 includes 16 data lines, then N is 15 (data lines 270₀ through 270₁₅). In FIG. 2, the label "M" (index M) next to a number (e.g., 250ₘ) represents the number of control gates of memory device 200. For example, if memory device 200 includes 128 control gates, then M is 127 (control gates 250₀ through 250₁₂₇). Memory device 200 can have the same number of control gates (e.g., M−1 control gates) among the blocks (e.g., blocks 290) of memory device 200.

In FIG. 2, data lines 270₀-270ₙ can include (or can be part of) bit lines (e.g., local bit lines) of memory device 200. As shown in FIG. 2, data lines 270₀-270ₙ can carry signals (e.g., bit line signals) BL₀ through BLₙ, respectively. In the physical structure of memory device 200, data lines 270₀-270ₙ can be structured as conductive lines and have respective lengths extending in the Y-direction (e.g., a direction from one memory block to another).

FIG. 2 shows directions X, Y, and Z that can be relative to the physical directions (e.g., dimensions) of the structure of memory device 200. For example, the Z-direction can be a direction perpendicular to (e.g., vertical direction with respect to) a substrate of memory device 200 (e.g., a substrate 399 shown in FIG. 3C). The Z-direction is perpendicular to the X-direction and Y-direction (e.g., the Z-direction is perpendicular to an X-Y plane of memory device 200).

As shown in FIG. 2, memory cells 202 can be organized into separate blocks (memory blocks or blocks of memory cells) such as blocks 290. FIG. 2 shows memory device 200 including three blocks 290 as an example. However, memory device 200 can include numerous blocks. The blocks (e.g., blocks 290) of memory device 200 can share data lines (e.g., data lines $270_0$-$270_N$) to carry information (in the form of signals) read from or to be stored in memory cells of selected memory cells (e.g., selected memory cells in block 290) of memory device 200.

Control gates $250_0$-$250_M$ in block 290 can be part of access lines (e.g., word lines). The access lines (that include control gates $250_0$-$250_M$) of memory device 200 can correspond to access lines 150 of memory device 100 of FIG. 1.

Each block 290 can have its own control gates $250_0$-$250_M$. Blocks 290 can be accessed separately (e.g., accessed one block at a time). A particular block 290 can be accessed using control gates $250_0$-$250_M$ of that particular block.

In the physical structure of memory device 200, control gates $250_0$-$250_M$ can be formed on different levels (e.g., layers) of memory device 200 in the Z-direction. In this example, the levels (e.g., layers) of control gates $250_0$-$250_M$ can be formed (e.g., stacked) one level (one layer of material) over another (another layer of material) in the Z-direction.

As shown in FIG. 2, memory cells 202 can be included in respective memory cell strings 230. For simplicity, only three memory cell strings 230 are labeled in FIG. 2. Each of memory cell strings 230 can have series-connected memory cells (e.g., M+1 (e.g., 128) series-connected memory cells) in the Z-direction. In a physical structure of memory device 200, memory cells 202 in each of memory cell strings 230 can be formed (e.g., stacked vertically one over another) in different levels (physical portions) of memory device 200. The levels of memory device 200 can be included in (or can correspond to) respective tiers (stacked one over another in the Z-direction) of memory device 200. In the example of FIG. 2, memory device 200 can include M+1 tiers (e.g., 128 tiers, where M=127) of memory cells and respective control gates. The number of memory cells 202 in each of memory cell strings 230 can be equal to the number of levels (e.g., the number of tiers). Thus, in the example of FIG. 2, there can be 128 levels (layers) of memory cells 202 in the Z-direction.

The number of memory cells 202 in each of memory cell strings 230 can also be equal to the number of levels (e.g., the number of tiers) of control gates (e.g., control gates $250_0$-$250_M$) of memory device 200. For example, if each memory cell string 230 has 128 (e.g., M=127) memory cells 202, then there are 128 corresponding levels (e.g., 128 tiers) of control gates $250_0$-$250_M$ for the 128 memory cells.

As shown in FIG. 2, control gates $250_0$-$250_M$ can carry corresponding signals $WL_0$-$WL_M$. For simplicity, FIG. 2 shows blocks 290 having the same labels $WL_0$-$WL_M$ for the control gates of a respective block 290. However, signals $WL_0$-$WL_M$ associated with one block 290 can be different from signals $WL_0$-$WL_M$ associated with another block 290.

As mentioned above, control gates $250_0$-$250_M$ can include (or can be parts of) access lines (e.g., word lines) of memory device 200. Each of control gates $250_0$-$250_M$ can be part of a structure (e.g., a level) of a conductive material (e.g., a layer of conductive material) located in a level of memory device 200. Memory device 200 can use signals $WL_0$-$WL_M$ in a particular block 290 to selectively control access to memory cells 202 of that particular block during an operation (e.g., read, write, or erase operation). For example, during a read operation, memory device 200 can use signals $WL_0$-$WL_M$ to control access to memory cells 202 of a particular block 290 to read (e.g., sense) information (e.g., previously stored information) from memory cells 202 of that particular block. In another example, during a write operation, memory device 200 can use signals $WL_0$-$WL_M$ to control access to memory cells 202 of a particular block 290 to store information in memory cells 202 of that particular block.

As shown in FIG. 2, memory cells 202 in different memory cell strings in block 290 can share (e.g., can be controlled by) the same control gate in block 290. For example, memory cells 202 (of different memory cell strings 230) coupled to control gate $250_0$ can share (can be controlled by) control gate $250_0$. In another example, memory cells 202 (of different memory cell strings 230) coupled to control gate $250_1$ can share (can be controlled by) control gate $250_1$.

Memory device 200 can include a source 298 that can carry a signal (e.g., a source line signal) SL. In the physical structure of memory device 200, source 298 and be called a source structure, a source region, a source plate, or source line. Source 298 can include (e.g., can be formed from) a conductive structure (e.g., that can include a combination of conductive regions) of memory device 200. The conductive structure of source 298 can include multiple levels (e.g., layers) of conductive materials stacked one over another over a substrate of memory device 200. Source 298 can be common conductive structure (e.g., common source plate or common source region) of block 290. Source 298 can be coupled to a ground connection (e.g., ground plate) of memory device 200. Alternatively, source 298 can be coupled to a connection (e.g., a conductive region) that is different from a ground connection.

As shown in FIG. 2, memory device 200 can include select transistors (e.g., drain select transistors) $261_0$ through $261_i$ ($261_0$-$261_i$) and select gates (e.g., drain select gates (SGDs)) $281_0$ through $281_i$ in block 290. Transistors $261_0$ can share the same select gate $281_0$. Transistors $261_i$ can share the same select gate $281_i$. Select gates $281_0$-$281_i$ can carry signals $SGD_0$ through $SGD_i$($SGD_0$-$SGD_i$), respectively.

Transistors $261_0$-$261_i$ can be controlled (e.g., turned on or turned off) by signals $SGD_0$-$SGD_i$, respectively. During a memory operation (e.g., a read or write operation) of memory device 200, transistors $261_0$ and transistors $261_i$ can be turned on one group at a time (e.g., either the group of transistors $261_0$ or the group of transistors $261_i$ can be turned on at a particular time). Transistors $261_0$ can be turned on (e.g., by activating signal $SGD_0$) to couple memory cell strings 230 of block 291 to respective data lines $270_0$-$270_N$. Transistors $261_i$ can be turned on (e.g., by activating signal $SGD_i$) to couple memory cell strings 230 of block 290 to respective data lines $270_0$-$270_N$. Transistors $261_0$-$261_i$ can be turned off (e.g., by deactivating signals $SGD_0$-$SGD_i$) to decouple the memory cell strings 230 of block 290 from respective data lines $270_0$-$270_N$.

Memory device 200 can include transistors (e.g., source select transistors) 260 in block 290, each of which can be coupled between source 298 and memory cells 202 in a respective memory cell string (one of memory cell strings 230) of block 290. Memory device 200 can include a select gate (e.g., source select gate (SGS)) 280 that can be shared by transistors 260. Transistors 260 can be controlled (e.g., turned on or turned off) by the same signal, such as SGS signal (e.g., source select gate signal) provided on select gate 280. During a memory operation (e.g., a read or write operation) of memory device 200, transistors 260 can be turned on (e.g., by activating an SGS signal) to couple memory cell strings 230 to source 298. Transistors 260 can be turned off (e.g., by deactivating the SGS signal) to decouple memory cell strings 230 from source 298.

As shown in FIG. 2, memory device 200 can include a data line routing region 243. In the physical structure of memory device 200, data line routing region 243 can be located between blocks 290 of memory device 200. Data line routing region 243 can include conductive paths (e.g., conductive pillars, not labeled) and other conductive elements (not labeled) to couple data lines $270_0$-$270_N$ to respective locations in source 298. As shown in FIG. 2, source (e.g., conductive structure) 298 can include a conductive region 298' (which is part of source 298). Data lines $270_0$-$270_N$ can be coupled to conductive region 298' through data line routing region 243. Detailed description of data line routing region 243 is included below with reference to FIG. 3A through FIG. 3H.

Memory device 200 shown in FIG. 2 includes other components, which are not shown in FIG. 2 so as not to obscure the example embodiments described herein. Some of the structures of memory device 200 are described below with reference to FIG. 3A through FIG. 3H. For simplicity, detailed description of the same element among the drawings (FIG. 1 through FIG. 5) is not repeated.

Figure 3A:
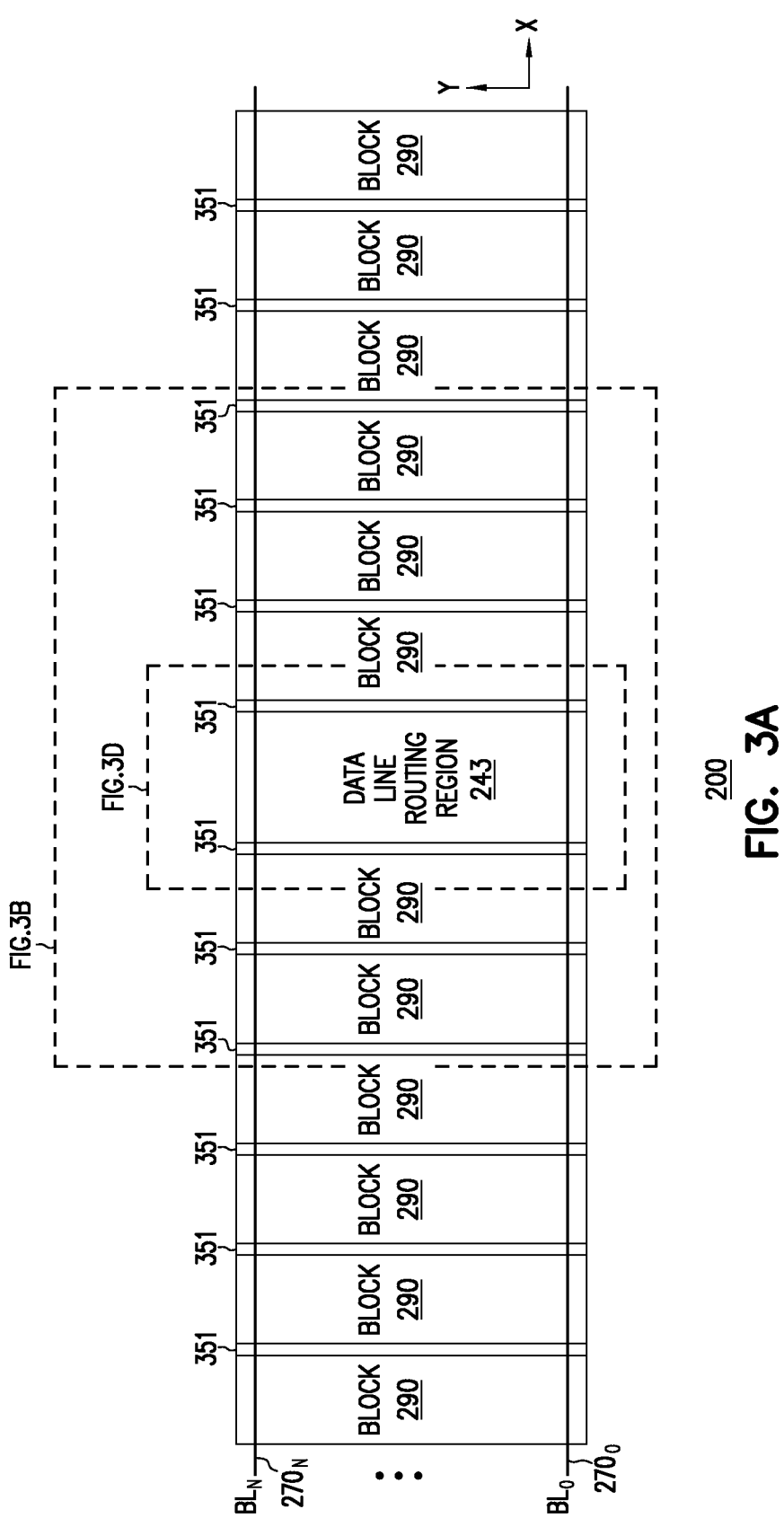
FIG. 3A shows a top view of a structure of the memory device of FIG. 2 including blocks, dielectric structures between respective blocks, and data lines, according to some embodiments described herein.

FIG. 3A shows a top view of a structure of memory device 200 including blocks 290, dielectric structures (e.g., block dividers) 351 between respective blocks 290, and data lines $270_0$ through $270_N$, according to some embodiments described herein.

In the figures (drawings) herein, similar or the same elements of memory device 200 of FIG. 2 and other figures (e.g., FIG. 3A through FIG. 5) are given the same labels. Detailed descriptions of similar or the same elements may not be repeated from one figure to another figure. For simplicity, cross-sectional lines (e.g., hatch lines) are omitted from some or all the elements shown in the drawings described herein. Some elements of memory device 200 may be omitted from a particular figure of the drawings so as not to obscure the view or the description of the element (or elements) being described in that particular figure. Further, the dimensions (e.g., physical structures) of the elements shown in the drawings described herein are not scaled.

As shown in FIG. 3A, blocks (blocks of memory cells) 290 of memory device 200 can be located side-by-side from one block to another in the X-direction. Each block 290 can have a length extending in the Y-direction and a width in the X-direction. The width is shorter than the length. FIG. 3A shows a certain number of blocks 290 (e.g., 12 blocks) as an example. Memory device 200 can include numerous blocks (e.g., up to a thousand (or more) blocks).

In FIG. 3A, dielectric structures 351 can be formed to divide (e.g., organize) memory device 200 into physical memory cell blocks (e.g., blocks 290). Dielectric structures 351 can have lengths extending in the Y-direction and width in the X-direction. Each of dielectric structures 351 can include (or can be formed in) a slit (not labeled) between two adjacent blocks 290. The slit can have sidewalls (e.g., edges) opposing each other in the X-direction and adjacent two respective blocks. The slit can include (or can be) a trench having a depth in the Z-direction. Each of dielectric structures 351 can include dielectric materials formed in a respective slit.

As shown in FIG. 3A, data lines $270_0$ through $270_N$ (associated with signals $BL_0$ through $BL_N$) of memory device 200 can be located over blocks 290 (with respect to the Z-direction). Data lines $270_0$ through $270_N$ can have respective lengths extending in the X-direction. Data lines $270_0$ through $270_N$ can extend over (e.g., on top of) and across (in the X-direction) blocks 290 and can be shared by blocks 290. Data lines $270_0$ through $270_N$ can also extend over (e.g., on top of) data line routing region 243. As shown in FIG. 3A, data line routing region 243 can be located between two adjacent blocks 290 (in the X-direction). A portion labeled "FIG. 3B" and "FIG. 3D" in FIG. 3A is shown in detail in FIG. 3B and FIG. 3D, respectively.

Figure 3B:
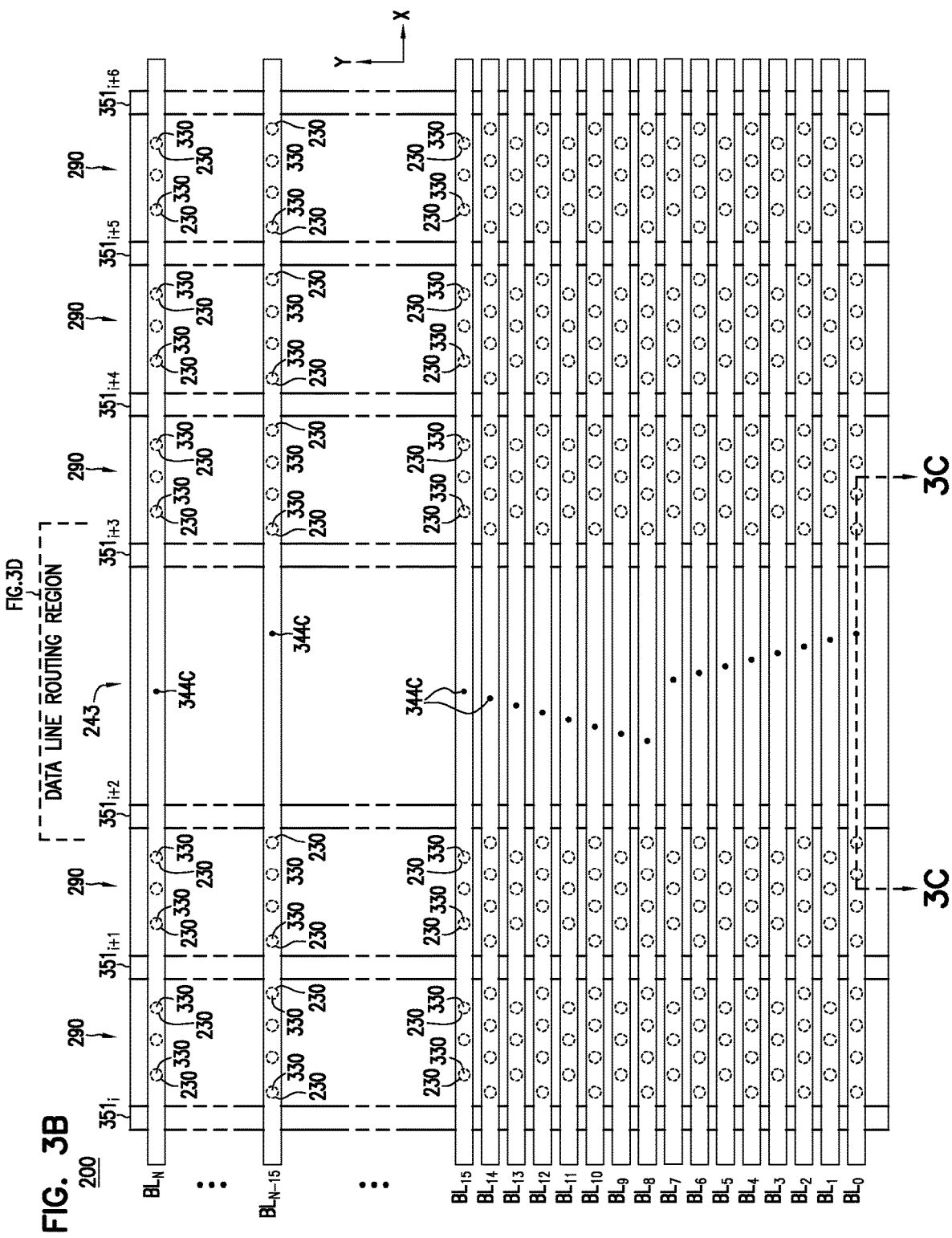
FIG. 3B shows detail of a portion of the memory device of FIG. 3A, according to some embodiments described herein.
Figure 3C:
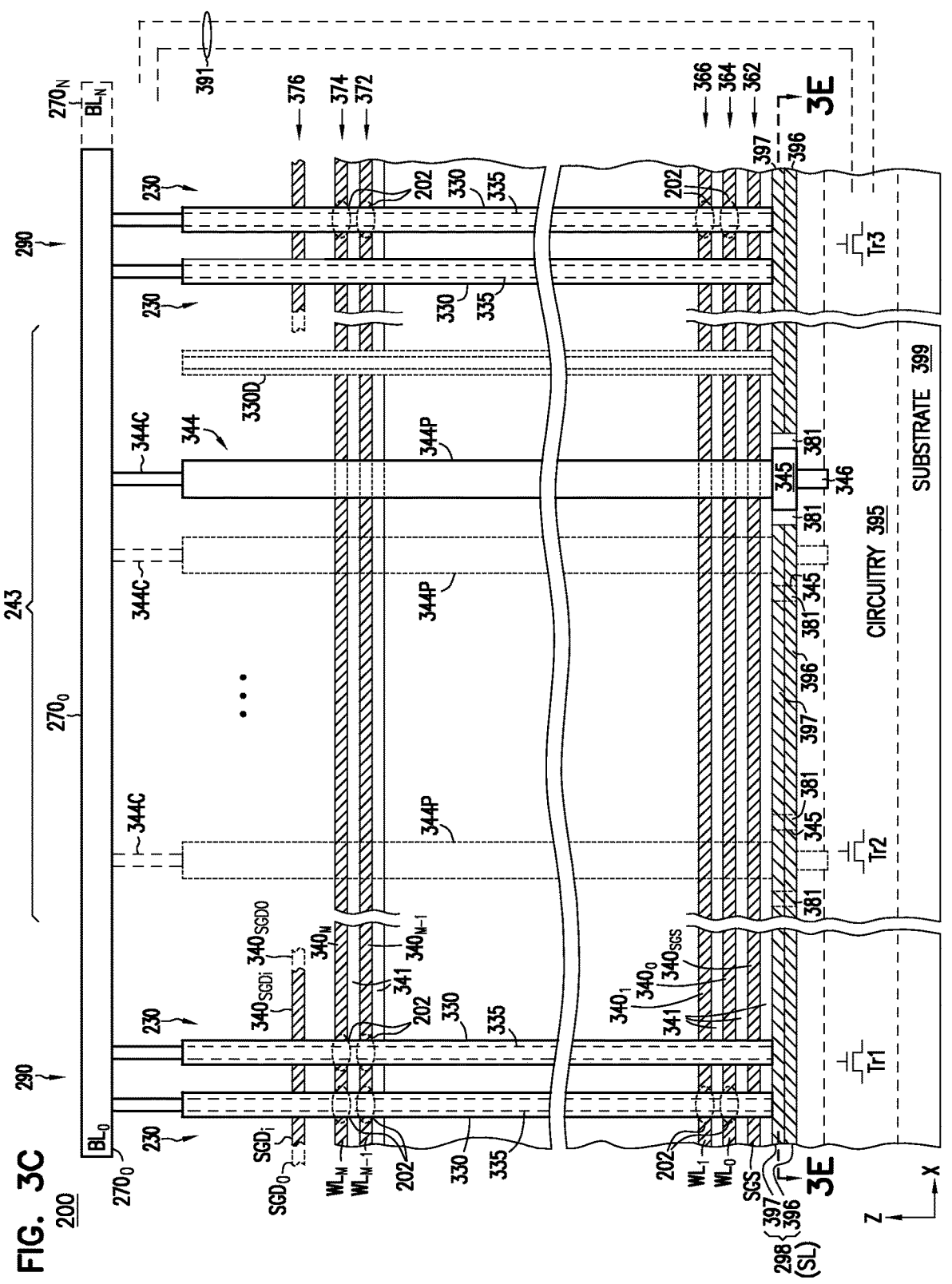
FIG. 3C shows a portion (e.g., side view in the X-Z direction) along line 3C-3C of the memory device of FIG. 3B, according to some embodiments described herein.
Figure 3D:
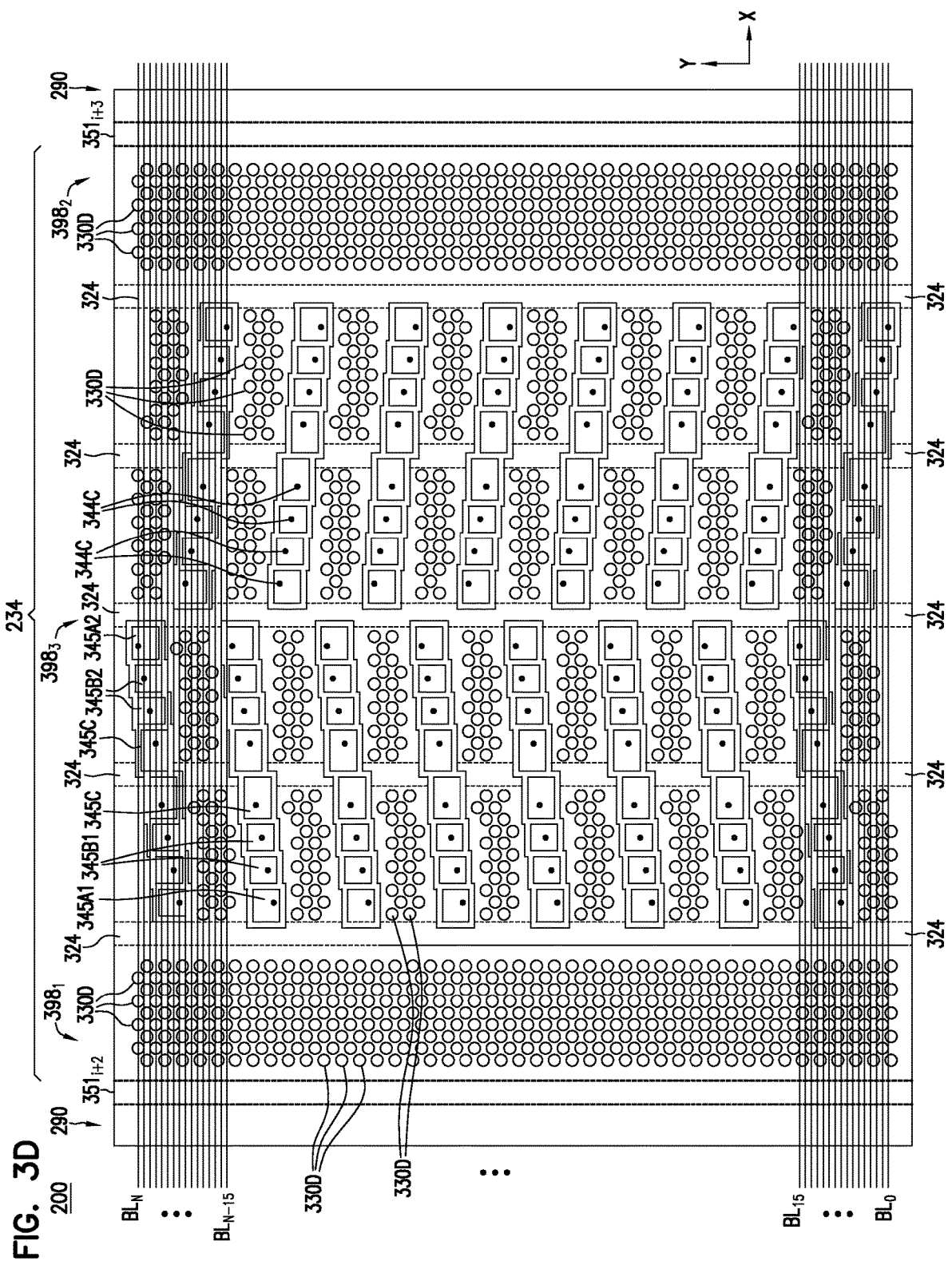
FIG. 3D shows a top view of the memory device of FIG. 3A and FIG. 3B, according to some embodiments described herein.

FIG. 3B show some of blocks 290 of FIG. 3A and dielectric structure $351_i$ through $351_{i+6}$, which correspond to some of dielectric structures 351 in FIG. 3A. In FIG. 3B, a portion labeled "FIG. 3D" (same label as in FIG. 3A) is shown in FIG. 3D. A portion (e.g., side view in the X-Z direction) of memory device 200 along line 3C-3C in FIG. 3B is shown in FIG. 3C. In FIG. 3B, data lines (16 data lines) associated with 16 signals $BL_0$ through $BL_{15}$ and data lines (16 data lines) associated with 16 signals $BL_{N-15}$ through $BL_N$ correspond to some of data lines $270_0$ through $270_N$ (associated with signals $BL_0$ through $BL_N$) of FIG. 3A and FIG. 2.

As shown in FIG. 3B, memory device 200 can include pillars 330 (shown in top view) in each of block 290. Pillars 330 are memory cell pillars. Each pillar 330 (FIG. 3B) is part of a respective memory cell string 230 (also schematically shown in FIG. 2). Pillars (memory cell pillars) 330 can be located under (below) and coupled to respective data lines $270_0$ through $270_N$. Thus, data lines $270_0$ through $270_N$ can be located over (above) pillars 330 (and over associated memory cell strings) coupled to respective pillars 330. Memory cells 202 of a memory cell string can be located (e.g., can be formed vertically in the Z-direction) along the length of a corresponding pillar 330. Pillars 330 (and associated memory cell strings) of different blocks 290 can share data lines $270_0$ through $270_N$.

As shown in FIG. 3B, data lines $270_0$ through $270_N$ (associated with signals $BL_0$ through $BL_N$, respectively) can also be located over (above) data line routing region 243. Data lines $270_0$ through $270_N$ can be coupled to respective contacts (conductive contacts) 344C, which are located under data lines $270_0$ through $270_N$ in the Z-direction.

FIG. 3C shows a portion (e.g., side view in the X-Z direction) of memory device 200 along line 3C-3C in FIG. 3B. As shown in FIG. 3C, memory device 200 can include levels 362, 364, 366, 372, 374, and 376 that are physical layers (e.g., portions) in the Z-direction of memory device 200.

Memory device 200 can include conductive materials $340_{SGS}$, $340_0$ through $340_M$ ($340_0$-$340_M$), and $340_{SGD0}$ through $340_{SGDi}$ ($340_{SGD0}$-$340_{SGDi}$) located (e.g., stacked) one level (e.g., one layer) over another in respective levels 362, 364, 366, 372, 374, and 376 (FIG. 3C) in the Z-direction. Conductive materials $340_{SGS}$, $340_0$-$340_M$, and $340_{SGD0}$-$340_{SGDi}$ can also be called levels of conductive materials $340_{SGS}$, $340_0$-$340_M$, and $340_{SGD0}$-$340_{SGDi}$. As shown in FIG. 3C, conductive materials $340_{SGD0}$-$340_{SGDi}$ can be located on the same level (e.g., level 376).

Conductive materials $340_{SGS}$, $340_0$-$340_M$, and $340_{SGD0}$-$340_{SGDi}$ can form (e.g., can be materials included in) respective select gate (e.g., source select gate) 280, control gates 250$_0$ through 250$_M$, and select gates (e.g., drain select gates) 280$_0$ and 280$_i$ (in FIG. 2) of memory device 200. For simplicity, only conductive materials 340$_0$, 340$_1$, 340$_{M-1}$, and 340$_M$ among conductive materials 340$_0$ through 340$_M$ (340$_0$-340$_M$) are shown in FIG. 3C and other figures described herein.

As shown in FIG. 3C, conductive materials 340$_{SGS}$, 340$_0$-340$_M$, and 340$_{SGDi}$ can interleave with dielectric materials 341 in the Z-direction. Conductive materials 340$_{SGS}$, 340$_0$-340$_M$, and 340$_{SGDi}$ can include metal (e.g., tungsten or other metal), other conductive materials, or a combination of conductive materials. Dielectric materials 341 can include silicon dioxide. Dielectric materials 341 can also be called levels of dielectric materials, which are formed to electrically separate (in the Z-direction) the control gates (formed by conductive materials 340$_0$-340$_M$) from each other and from other elements (e.g., source select gate and drain select gate) of memory device 200.

Signals SGS, WL$_0$, WL$_1$, WL$_{M-1}$, WL$_M$, SGD$_0$, and SGD$_i$ in FIG. 3C associated with respective conductive materials in FIG. 3C are the same signals shown in FIG. 2. Conductive material 340$_{SGS}$ in FIG. 3C can form select gate 280 (associated with signal SGS) of FIG. 2. Conductive materials 340$_0$-340$_M$ in FIG. 3C can form control gates 250$_0$ through 250$_M$ (associated with signals WL$_0$, WL$_1$, WL$_{M-1}$, and WL$_M$, respectively) of FIG. 2. Conductive material 340$_{SDG0}$ and 340$_{SGDi}$ (associated with signals SGD$_0$ and SGD$_i$) in FIG. 3C can form select gates 281$_0$ and 281$_i$, respectively, of FIG. 2.

FIG. 3C shows an example of memory device 200 including one level of conductive materials 340$_{SGS}$ that forms a select gate (e.g., source select gate associated with signal SGS). However, memory device 200 can include multiple levels (similar to level 362) of conductive materials (e.g., multiple levels of conductive material 340$_{SGS}$) located under (in the Z-direction) the level of conductive materials 340$_0$ (e.g., below level 364) to form multiple source select gates of memory device 200.

FIG. 3C shows an example of memory device 200 including one level (e.g., level 376) of multiple drain select gates (on the same level, formed by respective conductive materials 340$_{SGD0}$-340$_{SGDi}$). However, memory device 200 can include multiple levels (e.g., similar to level 376) stacked one over another in the Z-direction in which each of such multiple levels can include multiple drain select gates (e.g., four drain select gates in each of the multiple levels).

FIG. 3C also shows tiers of memory device 200 on respective levels 362, 364, 366, 372, 374, and 376. A tier of memory device 200 can include a level of conductive material (e.g., conductive material 340$_1$) and an adjacent level of dielectric material 341 (e.g., dielectric material 341 between conductive materials 340$_0$ and 340$_1$). As shown in FIG. 3C, the tiers can be located (e.g., stacked) one over another in the Z-direction over substrate 399 on respective levels 362, 364, 366, 372, 374, and 376.

FIG. 3C shows some of tiers of memory cells 202. Each tier of memory cells 202 can have respective memory cells 202 that are located on the same level (same tier) with respect to the Z-direction. For example, FIG. 3C shows four tiers of memory cells 202 located on four respective tiers (corresponding to four levels 364, 366, 372, and 374). Each block 290 of memory device 200 can also have their own tiers of memory cells 202 and respective memory control gates (e.g., respective word lines) for the memory cells. Each tier of memory cells 202 can have a respective control gate (e.g., a respective word line) for memory cells 202 of the respective tier. The control gate in a tier is formed by a respective level of conductive material among conductive materials 340$_0$-340$_M$. In the example of FIG. 3C, there are four tiers of control gates (associated with signals WL$_0$, WL$_1$, WL$_{M-1}$, and WL$_M$) on respective levels 364, 366, 372, and 374 for four respective tiers of memory cells 202 on levels 364, 366, 372, and 374. FIG. 3C shows a few tiers (e.g., four tiers) of memory device 200 for simplicity. However, memory device 200 can include up to (or more than) one hundred tiers.

As shown in FIG. 3C, memory device 200 can include a substrate 399 and materials 396 and 397 located over (e.g., formed over) substrate 399. Substrate 399 can include semiconductor (e.g., silicon) substrate. Substrate 399 can also include circuitry 395 located under other components (e.g., memory cells 202) that are formed over substrate 399. Circuitry 395 can include circuit elements (e.g., transistors Tr1, Tr2, and Tr3 shown in FIG. 3C) coupled to circuit elements formed in memory device 200 and outside substrate 399. The circuit elements that are formed outside (e.g., formed over) substrate 399 can include data lines 270$_0$ through 270$_N$, part of conductive paths 391 and other (not shown) conductive connections, and other circuit elements of memory device 200. Circuitry 395 can include numerous transistors. FIG. 3C symbolically shows such transistors as transistors Tr1, Tr2, and Tr3 for simplicity. The circuit elements (e.g., transistors Tr1, Tr2, and Tr3 and other elements) of circuitry 395 can be configured to perform part of a function of memory device 200. For example, transistors Tr1, Tr2, and Tr3 can form or can be part of decoder circuits, driver circuits (e.g., drivers 140 in FIG. 1), buffers, sense amplifiers, charge pumps, and other circuitry of memory device 200.

As shown in FIG. 3C conductive paths (e.g., conductive routings) 391 of memory device 200 can include portions extending in the Z-direction (e.g., extending vertically). Conductive paths 391 can be coupled to circuitry 395. For example, at least one of conductive paths 391 can be coupled to at least one of transistors Tr1, Tr2, and Tr3 of circuitry 395.

Materials 396 and 397 shown in FIG. 3C can be part of source (e.g., source structure or source region) 298 shown in FIG. 2. Materials 396 and 397 can include different conductive materials. An example of material 396 includes tungsten silicide (or other conductive materials). An example of material 397 includes polysilicon. Materials 396 and 397 can include other conductive materials. Material 397 can include a single level (e.g., a single layer) of material in the Z-direction. For example, material 397 can include a single level (e.g., a single layer) of polysilicon. Alternatively, material 397 can include multiple levels (e.g., layers) of materials in the Z-direction. For example, material 397 can include levels (e.g., layers) of polysilicon interleaved with levels (e.g., layers) of oxide (e.g., silicon dioxide). Materials 396 and 397 can be part of electrical connections (e.g., lateral connections (e.g., a conductive plate) in the X-direction or the Y-direction) between elements of memory device 200 in circuitry 395. As shown in FIG. 3C, materials 396 and 397 can form an electrical contact with pillars (memory cell pillars) 330 of memory cell strings 230.

As shown in FIG. 3C, each pillar 330 can include a structure 335 extending along the length (in the Z-direction) of pillar 330 and coupled to a respective data line (e.g., data line 270$_0$) and the source (which includes materials 396 and 397) of memory device 200. Structure 335 can include a conductive channel portion that can be part of a conductive path between a respective data line (e.g., data line $270_0$) and the source (e.g., includes materials 396 and 397) to carry current (e.g., current between data line $270_0$ and materials 396 and 397) during an operation (e.g., read, write, or erase) of memory device 200.

Structure 335 of pillar 330 can include multiple layers of different materials that can be part of a TANOS (TaN, $Al_2O_3$, $Si_3N_4$, $SiO_2$, Si) structure of pillar 330 or a structure similar to a TANOS structure. For example, structure 335 can include a dielectric portion (e.g., interpoly dielectric portion). The dielectric portion can include a charge blocking material or materials (e.g., a dielectric material including TaN and $Al_2O_3$) that can block a tunneling of a charge. Structure (e.g., TANOS structure) 335 can include a charge storage portion. The charge storage portion can include a charge storage element (e.g., charge storage material or materials, e.g., $Si_3N_4$) that can provide a charge storage function (e.g., trap charge) to represent a value of information stored in a respective memory cell 202. Structure (e.g., TANOS structure) 335 can include another dielectric portion (where the charge storage portion can be between the dielectric portions) that can include a tunnel dielectric material or materials (e.g., $SiO_2$). The tunnel dielectric material (or materials) can allow tunneling of a charge (e.g., electrons). In an alternative structure of memory device 200, structure 335 of pillar 330 can include or can be part be part of a SONOS (Si, $SiO_2$, $Si_3N_4$, $SiO_2$, Si) structure. In another alternative structure of memory device 200, structure 335 of pillar 330 can include or can be part of a floating gate structure. For example, structure 335 can include a charge storage portion that can include polysilicon (or other material) that can be part of a floating gate of a respective memory cell 202.

As shown in FIG. 3C, contact structures 344 can include respective contacts 344C and respective pillars (conductive pillars) 344P. Each pillar 344P can have a length extending in the Z-direction (e.g., extending vertically (e.g., outward) from substrate 399). Pillars 344P have a different structure from pillars (memory cell pillars) 330. Each pillar 344P can include a conductive portion extending along the length of pillar 344P can coupled to a respective contact 344C and a respective conductive island 345 (described below).

Contact 344C and pillar 344P of contact structure 344 can include a conductive material (e.g., metal (e.g., tungsten)). Contact structures 344 (including pillars 344P) can have the same length. Contact structures 344 can go through a respective portion of (e.g., go through respective holes in the tiers of) conductive materials $340_{SGS}$ and $340_0$-$340_M$ and dielectric materials 341. Thus, pillars 344P of contact structures 344 can be formed in holes in the tiers of memory device 200. Contact structures 344 are electrically separated from (not electrically coupled to) conductive materials $340_{SGS}$ and $340_0$-$340_M$.

As shown in FIG. 3C, memory device 200 can include conductive islands 345 formed under (formed below in the Z-direction) and electrically coupled to respective contact structures 344. Conductive islands 345 can be electrically separated (e.g., laterally separated in the X-direction and Y-direction) from each other by respective dielectric isolators 381. Conductive islands 345 can be coupled to respective pillars 344P of contact structures 344. Conductive islands 345 can also be coupled to respective conductive portions 346. Conductive portions 346 can be coupled to other elements (e.g., transistors Tr1, Tr2, and Tr3) of circuitry 395. Thus, contact structures 344 can form electrical connections with circuitry 395 through respective pillars 344P, conductive islands 345, and conductive portions 346.

Conductive islands 345 can be part of source 298 (which includes materials 396 and 397). For example, each conductive island 345 can include a separate portion of source 298. Thus, each conductive island 345 can include a portion of materials 396 and 397.

As shown in FIG. 3C, pillars (conductive pillars) 344P can extend between respective data lines $270_0$ through $270_N$ and respective conductive island 345. Pillars 344P can be coupled to (e.g., electrically in contact with) respective data lines $270_0$ through $270_N$ and respective conductive islands 345. Thus, data line $270_0$ can be coupled to a respective conductive island 345 through a respective contact structure 344 (which includes a respective contact 344C and a respective conductive contact 344C). Other data lines (e.g., data lines $270_1$ through $270_N$) can also be coupled to respective conductive islands 345 like data line $270_0$.

Memory device 200 can include dummy memory cell pillars 330D. Only one dummy memory cell pillar 330D is shown (show in side view) in FIG. 3C for simplicity. FIG. 3D (described below) shows a top view of more dummy memory cell pillars 330D.

A dummy memory cell pillar 330D includes the same structure (e.g., TANOS, SONOS, or floating gate structure) as memory cell pillar 330 described above. Thus, like each memory cell pillar 330, each dummy memory cell pillar 330D (shown in FIG. 3C and FIG. 3D) can include a memory cell string (like memory cell string 230 (FIG. 2 and FIG. 3C)) that includes series-connected memory cells stacked one over another in the Z-direction. For example, each dummy memory cell pillar 330D can include M+1 (e.g., M+1=128) series-connected memory cells) in the Z-direction. Unlike memory cells of memory cell pillar 330 of memory cell string 230, memory cells in a dummy memory cell pillar 330D are dummy memory cells. The dummy memory cells are non-functional memory cells that are not used (e.g., not configured) to store information. As shown in FIG. 3C (and FIG. 3D) dummy memory cell pillars 330D are not coupled to data lines $270_0$ through $270_N$.

Dummy memory cell pillar 330D and memory cell pillar 330 are different portions of initial memory cell pillars that are formed at the same time (in the same process) during forming memory device 200. During formation of memory device 200, initial memory cell pillars are formed in different regions of memory device 200. However, some particular regions of memory device 200 may be used to form other components (e.g., data line routing region 243) of memory device 200. Such particular regions may have initial memory cell pillars ready formed thereon. Initial memory cell pillars in such particular regions are unused and become dummy memory cell pillars (non-functional memory pillars) like dummy memory cell pillars 330D (FIG. 3C and FIG. 3D). The rest of the initial memory cell pillars (e.g., memory cell pillars 330 in FIG. 3C and FIG. 3D) in other regions are functional memory cell pillars that are used to store information.

Figure 3E:
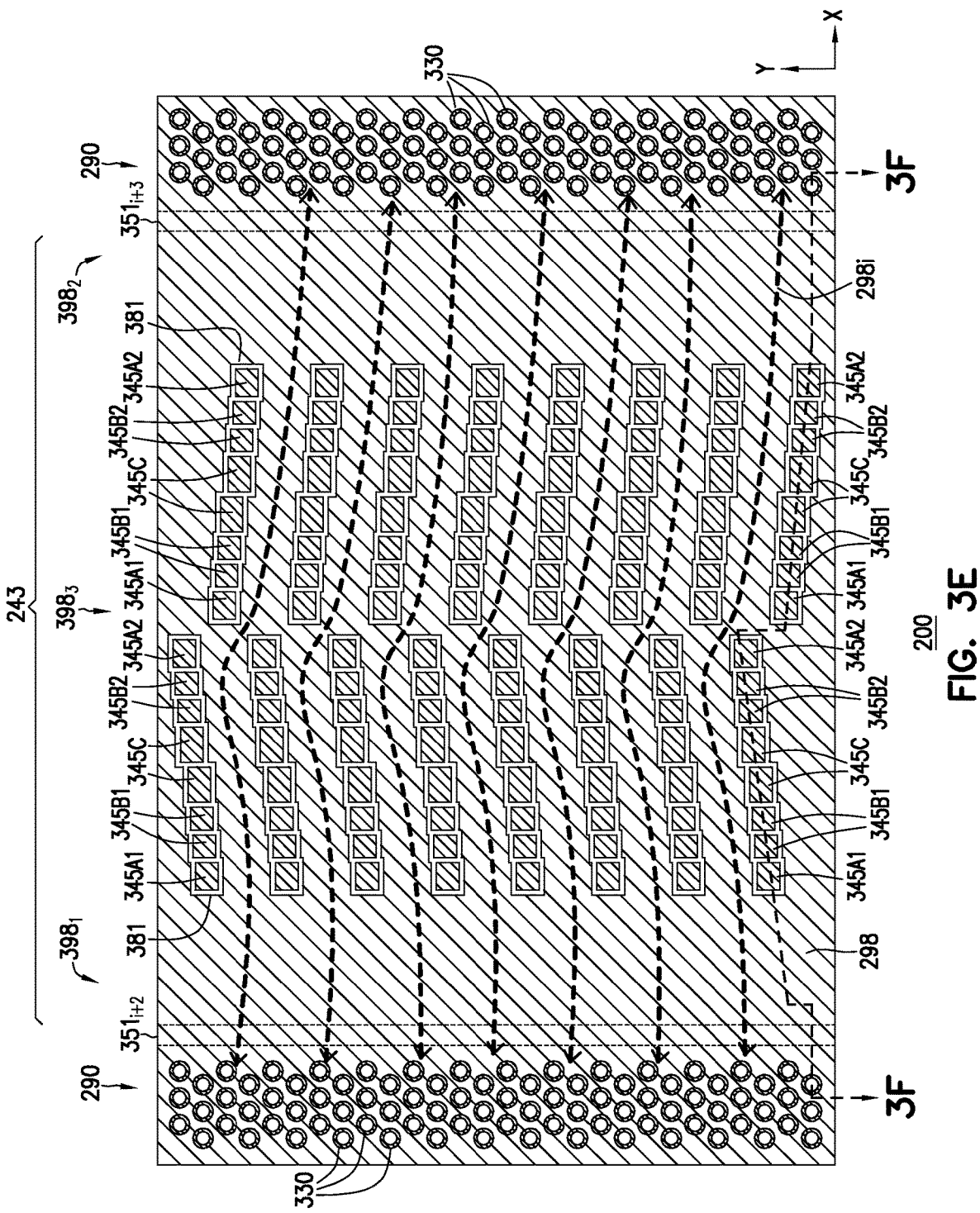
FIG. 3E shows a portion of the memory device of FIG. 3D, according to some embodiments described herein.

A portion (e.g., side view in X-Z direction) of memory device 200 along line 3E-3E in FIG. 3C is shown in FIG. 3E (described below)

Figure 3F:
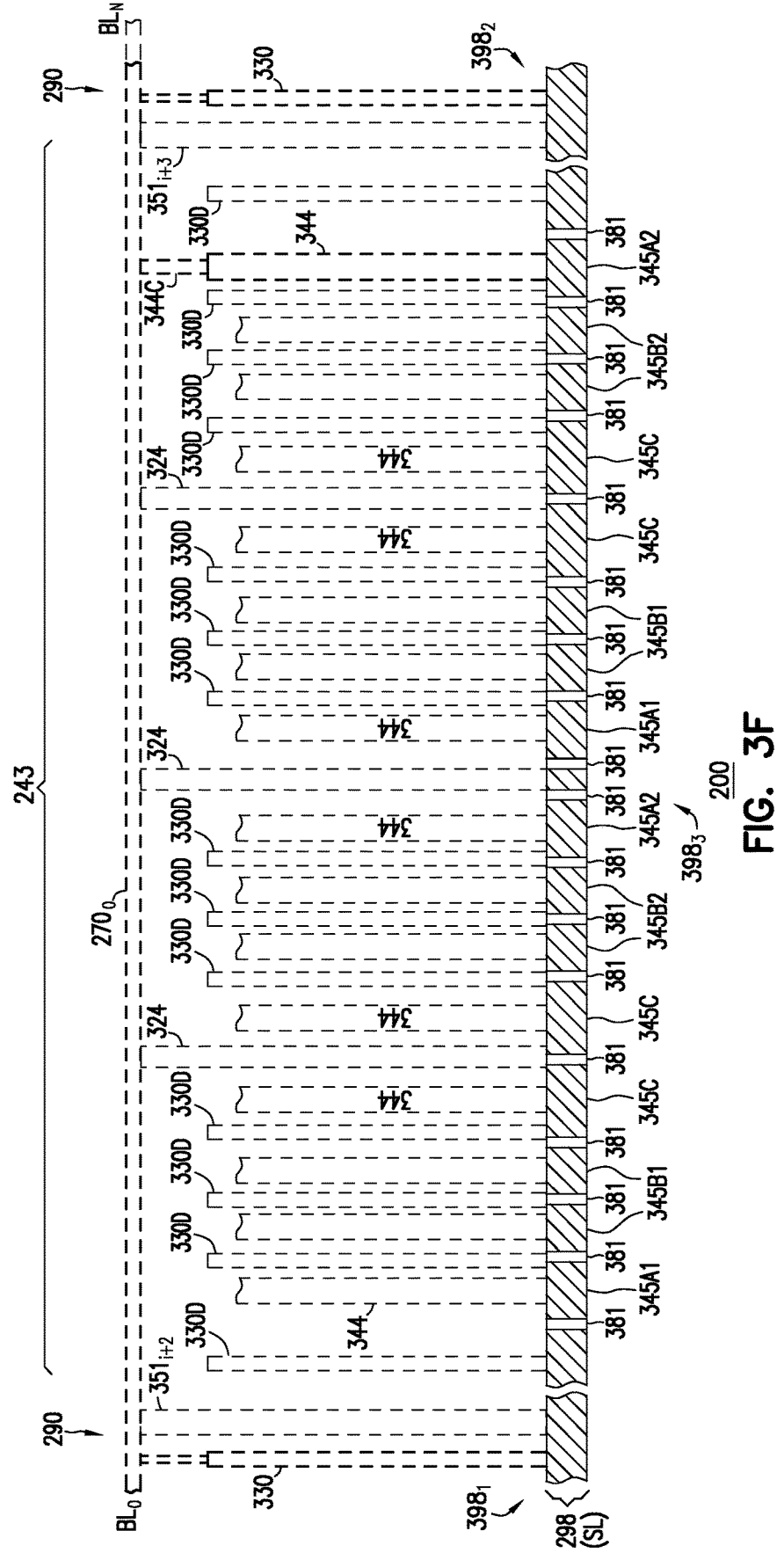
FIG. 3F shows a side view of a portion along line 3F-3F of the memory device of FIG. 3E, according to some embodiments described herein.

The following description refers to FIG. 3D, FIG. 3E, and FIG. 3F. FIG. 3D shows a top view of memory device 200 including the portion labeled "FIG. 3D" in FIG. 3A and FIG. 3B. FIG. 3E shows a portion of memory device 200 of FIG. 3D including of a portion of source 298 (along line 3E-3E of FIG. 3C) and pillars (memory cell pillars) 330 of respective blocks 290. FIG. 3F shows a side view of the portion of source 298 and pillars 330 along line 3F-3F of FIG. 3E.

In FIG. 3D, FIG. 3E, and FIG. 3F, dielectric structures $351_{i+2}$ and $351_{i+3}$ are the same as those shown in FIG. 3B. As shown in FIG. 3F, dielectric structures $351_{1+2}$ and $351_{i+3}$ (and other dielectric structures 351 in FIG. 3A) are formed over source 298, such that dielectric structures $351_{1+2}$ and $351_{i+3}$ (and other dielectric structures 351 in FIG. 3A) do not cut into source 298 between blocks 290. Thus, source 298 can extend continuously from block to block under dielectric structures $351_{1+2}$ and $351_{i+3}$ (and other dielectric structures 351 in FIG. 3A).

In FIG. 3D, FIG. 3E, and FIG. 3F, dielectric structures $351_{i+2}$ and $340_{i+3}$ are the same as those shown in FIG. 3B. As shown in FIG. 3F, dielectric structures $351_{1+2}$ and $351_{i+3}$ (and other dielectric structures 351 in FIG. 3A) are formed over source 298 and do not divide source 298 between blocks 290. Thus, as shown in FIG. 3D, FIG. 3E, and FIG. 3F, source 298 can extend continuously from block to block under dielectric structures $351_{i+2}$ and $351_{i+3}$ (and other dielectric structures 351 in FIG. 3A).

As shown in FIG. 3D and FIG. 3F, memory device 200 can include dielectric regions 324 having lengths in the Y-direction. FIG. 3F shows some of dielectric regions 324 of FIG. 3D. As shown in FIG. 3D and FIG. 3F, dummy memory cell pillars 330D are not formed in dielectric regions 324. Dielectric regions 324 are formed over source 298 like dielectric structures $351_{1+2}$ and $351_{i+3}$. Thus, as shown in FIG. 3F, source 298 can also extend continuously under dielectric regions 324 (not labeled in FIG. 3E).

As shown in FIG. 3D, FIG. 3E, and FIG. 3F, the conductive structure (formed by materials 296 and 297 in FIG. 3C) of source 298 can include conductive regions $398_1$, $398_2$, and $398_3$, where conductive region $398_2$ is between conductive regions $398_1$ and $398_3$. As shown in FIG. 3D and FIG. 3F, each of conductive regions $398_1$, $398_2$, and $398_3$ can be located under (e.g., directly below) dummy memory cell pillars 330D can be located over each of conductive regions $398_1$, $398_2$, and $398_3$. Conductive regions $398_1$ and $398_3$ in respective blocks 290 (FIG. 3E and FIG. 3F) can be located under (e.g., directly below) memory cell pillars 330 (which include memory cells 202 as shown in FIG. 3C).

As shown in FIG. 3E, the conductive structure of source 298 can be a continuous conductive structure between conductive regions $398_1$, $398_2$, and $398_3$, such that current can flow in conductive regions $398_1$, $398_2$, and $398_3$ through many conductive paths $298i$. Each conductive path $298i$ can include (e.g., can be formed in part by) conductive portions (e.g., conductive portions 398P1, 398P2, and 398P3 in FIG. 3G) adjacent conductive islands 345A1, 345A2, 345B1, 345B2, and 345C.

As shown in FIG. 3D and FIG. 3F, each of conductive islands 345A1, 345A2, 345B1, 345B2, and 345C can be coupled to a respective data line (one of data lines $270_0$ through $270_N$) through contact 344C of a respective contact structure 344. For example, as shown in FIG. 3D and FIG. 3E, a group of 16 conductive islands 345A1, 345A2, 345B1, 345B2, and 345C can be coupled to a group of 16 data lines (associated with signals lines $BL_0$ through $BL_{15}$). Another group of 16 conductive islands 345A1, 345A2, 345B1, 345B2, and 345C can be coupled to a group of another 16 data lines (associated with signals lines $BL_{N-15}$ through $BL_N$). FIG. 3D, FIG. 3E, and FIG. 3F show a group of 16 conductive islands adjacent each other in a row (e.g., staggered row) in the X-direction as an example. However, the number of conductive islands adjacent each other in a row (e.g., staggered row) in the X-direction can be different from 16. For example, FIG. 4 and FIG. 5 (described below) show an example where source 298 can include eight conductive islands adjacent each other in a row (e.g., staggered row) in the X-direction.

Figures 3G, 3H:
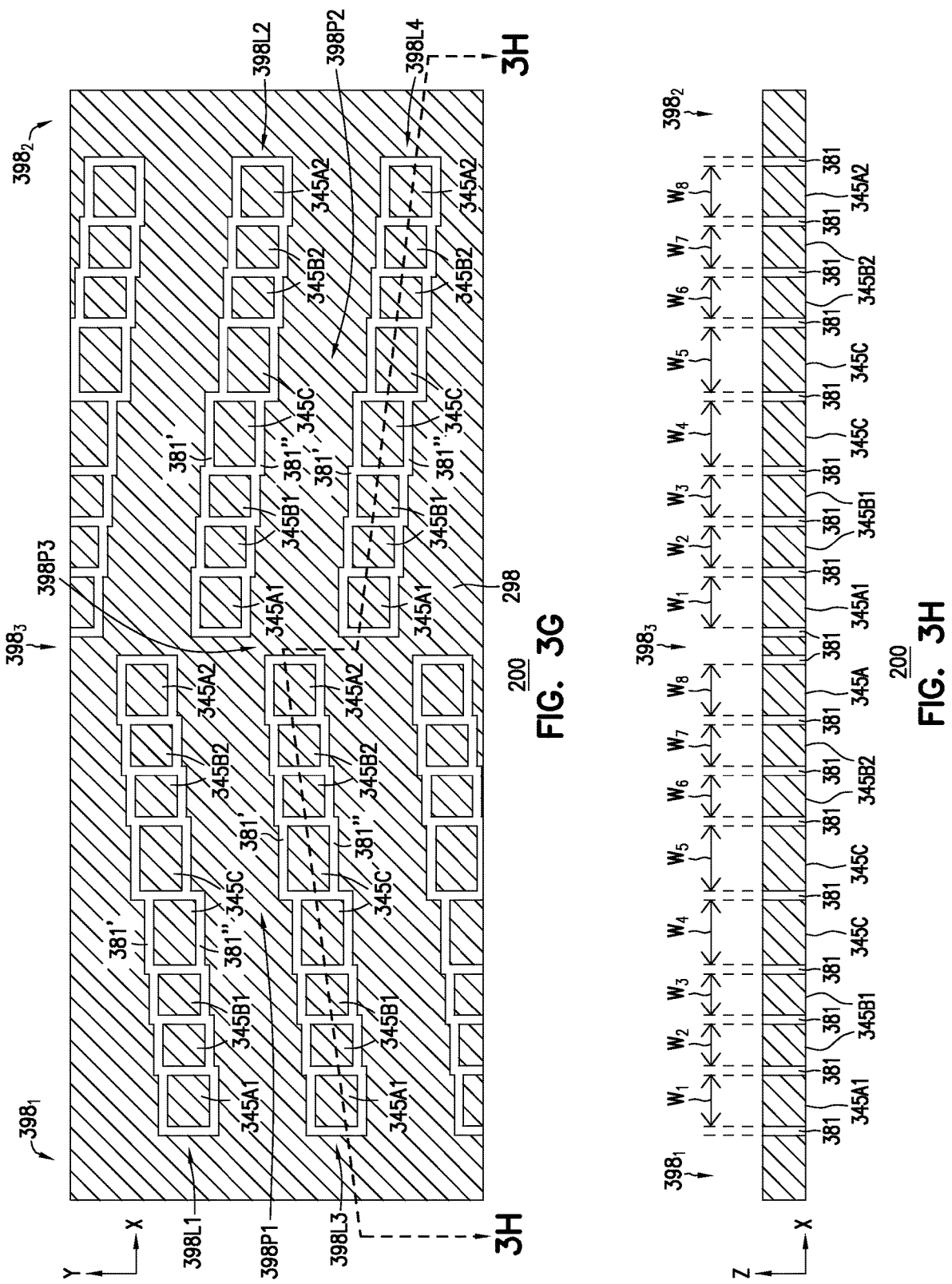
FIG. 3G and FIG. 3H show a top view and a side view, respectively, of a portion of the memory device of FIG. 3E, according to some embodiments described herein.

FIG. 3G and FIG. 3H show a top view and a side view, respectively, of a portion of memory device 200 of FIG. 3E. FIG. 3H is a portion of memory device 200 along line 3H-3H of FIG. 3G. As shown in FIG. 3G and FIG. 3H, conductive islands 345A1, 345A2, 345B1, 345B2, and 345C (which are part or the conductive structure of source 298) can be formed in conductive regions $398_2$ between conductive regions $398_1$ and $398_3$. Conductive islands 345A1, 345A2, 345B1, 345B2, and 345C can be formed in group. The total number of conductive islands 345A1, 345A2, 345B1, 345B2, and 345C in a group can be an even number (e.g., eight conductive islands in a group). The total number of dielectric isolators 381 between the conductive islands 345A1, 345A2, 345B1, 345B2, and 345C in a group can be an odd number (e.g., nine dielectric isolators 381).

As shown in FIG. 3G, conductive islands 345A1, 345A2, 345B1, 345B2, and 345C in each group can also be separated (electrically separated) from conductive regions $398_2$ by respective dielectric isolators 381, 381', and 381". As shown in FIG. 3H, conductive islands 345A1, 345A2, 345B1, 345B2, and 345C in each group can also be separated (electrically separated) from each other by respective dielectric isolators 381.

As shown in FIG. 3G, conductive islands 345A1, 345A2, 345B1, 345B2, and 345C in a group can be formed in a respective location in conductive region $398_3$, such as in one of locations 398L1, 398L2, 398L3, and 398L4. Conductive region $398_3$ can include a conductive portion 398P1 between locations 398L1 and 398L3, a conductive portion 398P2 between locations 398L2 and 398L4, and a conductive portion 398P3 between conductive portions 398P1 and 398P2 and in electrical contact with conductive portions 398P1 and 398P2. Thus, conductive portions 398P1, 398P2, and 398P2 can form part of a conductive path (e.g., conductive path $298i$ in FIG. 3E) between conductive regions $398_1$, $398_2$, and $398_3$.

As shown in FIG. 3G and FIG. 3H, conductive islands 345A1, 345A2, 345B1, 345B2, and 345C in each group can be adjacent each other, such that a portion of the conductive islands (e.g., conductive islands 345A1, 345A2, 345B1, and 345B2) in the group can be located (e.g., formed) on one side (e.g., left side in the X-direction) of conductive islands 345C, and another portion of the conductive islands (e.g., conductive islands 345A1, 345A2, 345B1, and 345B2) in the group can be located (e.g., formed) on another side (e.g., right side in the X-direction) of conductive islands 345C. Conductive islands 345C can be called a pair of conductive islands or middle conductive islands.

As shown in FIG. 3H, conductive islands 345A1, 345A2, 345B1, 345B2, and 345C can have respective widths $W_1$ through $W_8$. Widths $W_1$ and $W_8$ can be equal to each other. Widths $W_2$, $W_3$, $W_6$, and $W_7$ can be equal to each other. Widths $W_4$ and $W_5$ can be equal to each other. Width $W_4$ or $W_5$ can be greater than each of the other widths (e.g., widths $W_1$, $W_2$, $W_3$, $W_6$, $W_7$, and $W_8$). Width $W_4$ or $W_8$ can be greater than each of widths $W_2$, $W_3$, and $W_6$, $W_7$).

Thus, as shown in FIG. 3H, the width ($W_4$ or $W_5$) of one of conductive islands 345C is greater than the width (e.g., $W_1$, $W_2$, or $W_3$) of at least one conductive island 345A1 and 345B1 and the width (e.g., $W_6$, $W_7$, or $W_8$) of at least one conductive island 345A2 and 345B2. Conductive island 345A1 can include a width ($W_1$) greater than a width ($W_2$ or $W_3$) of each of other conductive islands 345B1. Conductive island 345A2 can include a width ($W_8$) greater than a width ($W_6$ or $W_7$) of each of other conductive islands 345B2.

Forming (e.g., structuring) conductive islands 345A1, 345A2, 345B1, 345B2, and 345C as shown in FIGS. 3G and 3H can provide improvements and benefit to memory device 200. For example, without forming conductive islands 345C with a greater width relative to the widths of other conductive islands (e.g., conductive islands 345A1, 345A2, 345B1, 345B2), contact structures 344 (which are formed on conductive islands 345C) may fail to completely land on respective conductive islands 345C. For example, referring to FIG. 3F, a portion of contact structure 344 may fall off (e.g., become misaligned with) respective conductive islands 345C if conductive islands 345C are formed with a width like the width ($W_2$, $W_3$, $W_4$, or $W_5$) of conductive island 345B1 or 345B2. Such a falloff may degrade the connection between contact structure 344 and a respective conductive island 345C. This can lead to poor or unreliable device performance. However, as shown in FIG. 3G and FIG. 3H, conductive islands 345C can be formed with relatively a greater width (e.g., $W_4$). This can avoid the falloff situation. Therefore, the reliability and performance of memory device 200 can be improved.

Similarly, without forming conductive islands 345A1 and 345A2 with a greater width relative to the widths of conductive islands 345B1 and 345B2, contact structures 344 may not completely land on respective conductive islands 345A1 and 345A2. This can also lead to poor or unreliable device performance. However, as shown in FIG. 3G and FIG. 3H, conductive islands 345A1 and 345A2 can be formed with a relatively greater width than conductive islands 345B1 and 345B2. This can improve the connection between contact structures 344 and respective conductive islands 345B1 and 345B2, leading to further improvement in the reliability and performance of memory device 200.

Figures 3I, 3J:
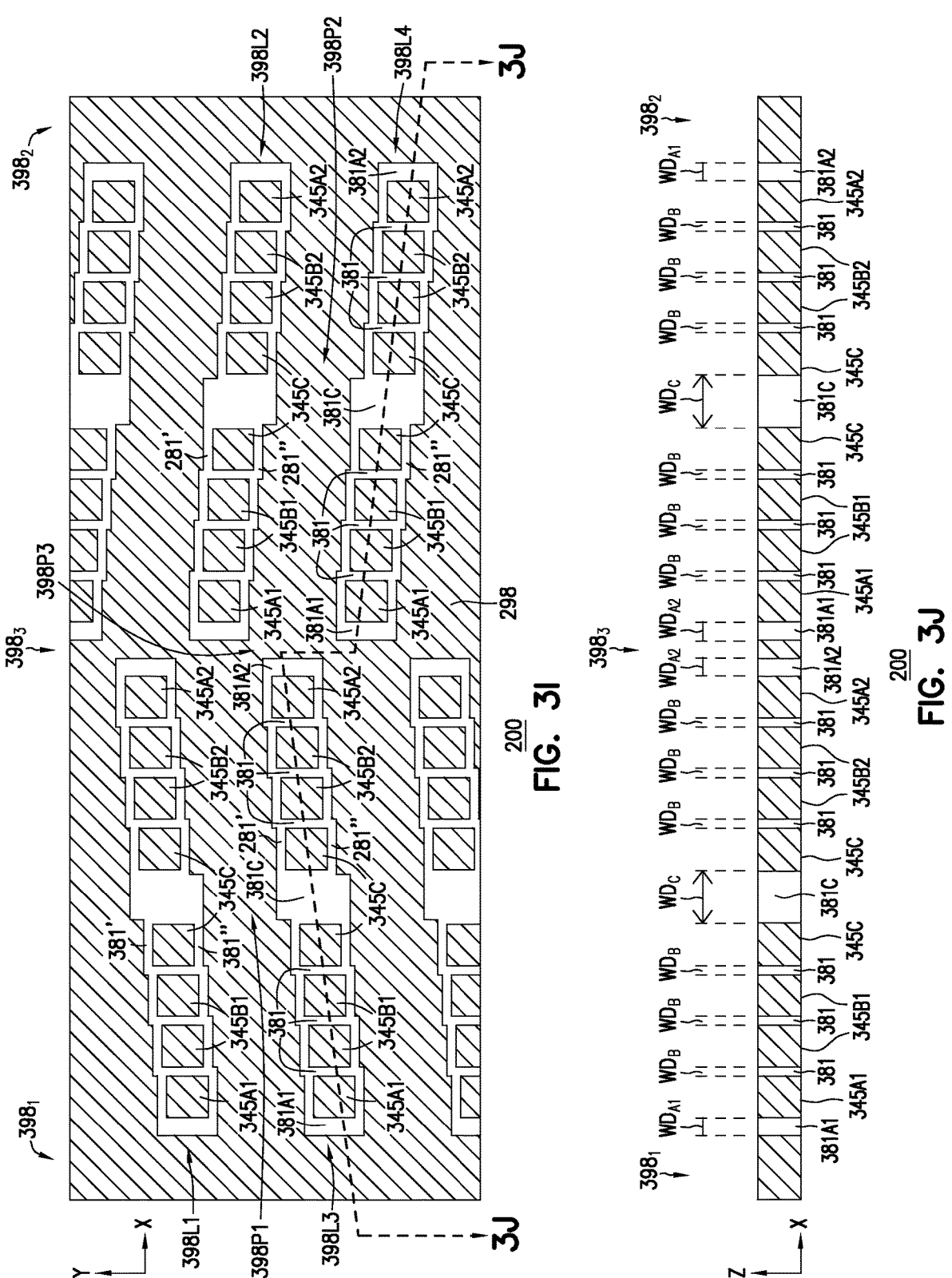
FIG. 3I and FIG. 3J show a top view and a side view, respectively, of a portion of an alternative structure of the memory device of FIG. 3G and FIG. 3H.

FIG. 3I and FIG. 3J show a top view and a side view, respectively, of a portion of an alternative structure of memory device 200 of FIG. 3G and FIG. 3H, respectively. FIG. 3J is a portion of memory device 200 along line 3J-3J of FIG. 3I. Differences between FIG. 3I and FIG. 3G include differences in the structures of the conductive islands (e.g., conductive islands 345A1, 345A2, 345B1, 345B2, and 345C) and dielectric isolators (e.g., dielectric isolators 381, 381A1, 381A2, and 381C) between the conductive islands.

Like FIG. 3G, the total number of conductive islands 345A1, 345A2, 345B1, 345B2, and 345C in a group (at a respective location 398L1, 398L2, 398L3, or 398L4) in FIG. 3I can be an even number (e.g., eight conductive islands in a group). As shown in FIG. 3I and FIG. 3J, conductive islands 345A1, 345A2, 345B1, 345B2, and 345C can have the same width (equal width) in the X-direction. In comparison with FIG. 3G and FIG. 3H, conductive islands 345A1, 345A2, 345B1, 345B2, and 345C in FIG. 3I and FIG. 3J can have different widths (unequal widths), as described above.

Like FIG. 3G, the total number of dielectric isolators 381, 381A1, 381A2, and 381C between the conductive islands 345A1, 345A2, 345B1, 345B2, and 345C in a group in FIG. 3I can be an odd number (e.g., nine dielectric isolators 381, 381A1, 381A2, and 381C). As shown in FIG. 3I and FIG. 3J, dielectric isolators 381, 381A1, 381A2, and 381C can have different widths (unequal widths) in the X-direction. In comparison with FIG. 3G and FIG. 3H, dielectric isolators 381 in FIG. 3I and FIG. 3J can have the same width.

As shown in FIG. 3I and FIG. 3J, dielectric isolators 381, 381A1, 381A2, and 381C can be formed such that one-half (e.g., four) of the total number (e.g., eight) of conductive islands 345A1, 345A2, 345B1, 345B2, and 345C can be located on one side (e.g., left side in the X-direction) of dielectric isolator 381C, and another one-half (e.g., four) of the total number of the conductive islands 345A1, 345A2, 345B1, 345B2, and 345C can be located on another side (e.g., right side in the X-direction) of dielectric isolator 381C.

As shown in FIG. 3J, dielectric isolators 381, 381A1, 381A2, and 381C can have respective width $WD_{A1}$, $WD_{A2}$, $WD_B$, and $WD_C$. Widths $WD_C$ is a greatest width among widths $WD_{A1}$, $WD_{A2}$, $WD_B$, and $WD_C$. In an example, the width ($WD_C$) of dielectric isolator 381C can be at least one and a half times (1.5 times) greater than the width ($WD_{A1}$, $WD_{A2}$, or $WD_B$) of each of dielectric isolators 381, 381A1, and 381A2. In another example, the width ($WD_C$) of dielectric isolator 381C can be at least two times (2 times) greater than the width ($WD_{A1}$, $WD_{A2}$, or $WD_B$) of each of dielectric isolators 381, 381A1, and 381A2. Widths $WD_{A1}$ and $WD_{A2}$ can be equal to each other. Widths $WD_{A1}$ or $WD_{A2}$ can be greater than width $WD_B$. Thus, dielectric isolator 381A1 can have a width ($WD_{A1}$) greater than a width ($WD_B$) of each of dielectric isolators 381.

Forming (e.g., structuring) dielectric isolators 381, 381A1, 381A2, and 381C as shown in FIGS. 3I and 3J can provide improvements and benefit to memory device 200. For example, without forming dielectric isolators 381C with a greater width relative to the widths of other dielectric isolators (e.g., dielectric isolators 381, 381A1, and 381A2), the width of conductive islands 345 may be limited to a relative smaller width (e.g., like width $W_1$ or $W_3$ in FIG. 3H). This may cause contact structure 344 to fail to completely land on respective conductive islands 345C (e.g., due to a relatively smaller width than conductive islands 345C). This can lead to poor or unreliable device performance. However, as shown in FIG. 3I and FIG. 3J, dielectric isolators 381C can be formed with a relatively greater width (e.g., $WD_C$). This allows more room for conductive island 345C to be enlarged (into a portion of dielectric isolators 381C) like conductive island 345C of FIG. 3G and FIG. 3H. This can avoid the falloff situation associated with contact structures 344 formed over respective conductive islands 345C. Therefore, the reliability and performance of memory device 200 can be improved.

Similarly, without forming dielectric isolators 381A1 and 381A2 with a greater width relative to the widths of dielectric isolators 381, the width of conductive islands 345A1 and 345A2 may be limited to a relatively smaller width (e.g., like width W2 or W3 in FIG. 3H). This can also lead to poor or unreliable device performance. However, as shown in FIG. 3I and FIG. 3J, due to a relatively greater width than width $WD_B$, conductive islands 345A1 and 345A2 can be enlarged (into a portion of dielectric isolators 381A1) like conductive island 345A1 and 345A2 of FIG. 3G and FIG. 3H. This can avoid the falloff situation associated with contact structures 344 formed over respective conductive islands 345A1 and 345A2. This can improve the connection between contact structures 344 and respective conductive islands 345A1 and 345A2, leading to further improvement in the reliability and performance of memory device 200.

Further, as shown in FIG. 3I, there are no dielectric isolators between and connecting dielectric isolators 381A1 and 381A2 together at portion 398P3 of the structure of source 298. Thus, a conductive path (like conductive path 298$i$ in FIG. 3E) can be formed between portions 398P1 and 398P2 through portion 398P3 in a relatively short path. This avoids an alternative longer conductive path to be formed between portions 398P1 and 398P2 if such conductive path is not formed through portion 398P3. Therefore, the resistivity of a conductive path (like conductive path **298*i* in FIG. 3E) between portions 398P1 and 398P2** can be maintained or improved.

Figure 4:
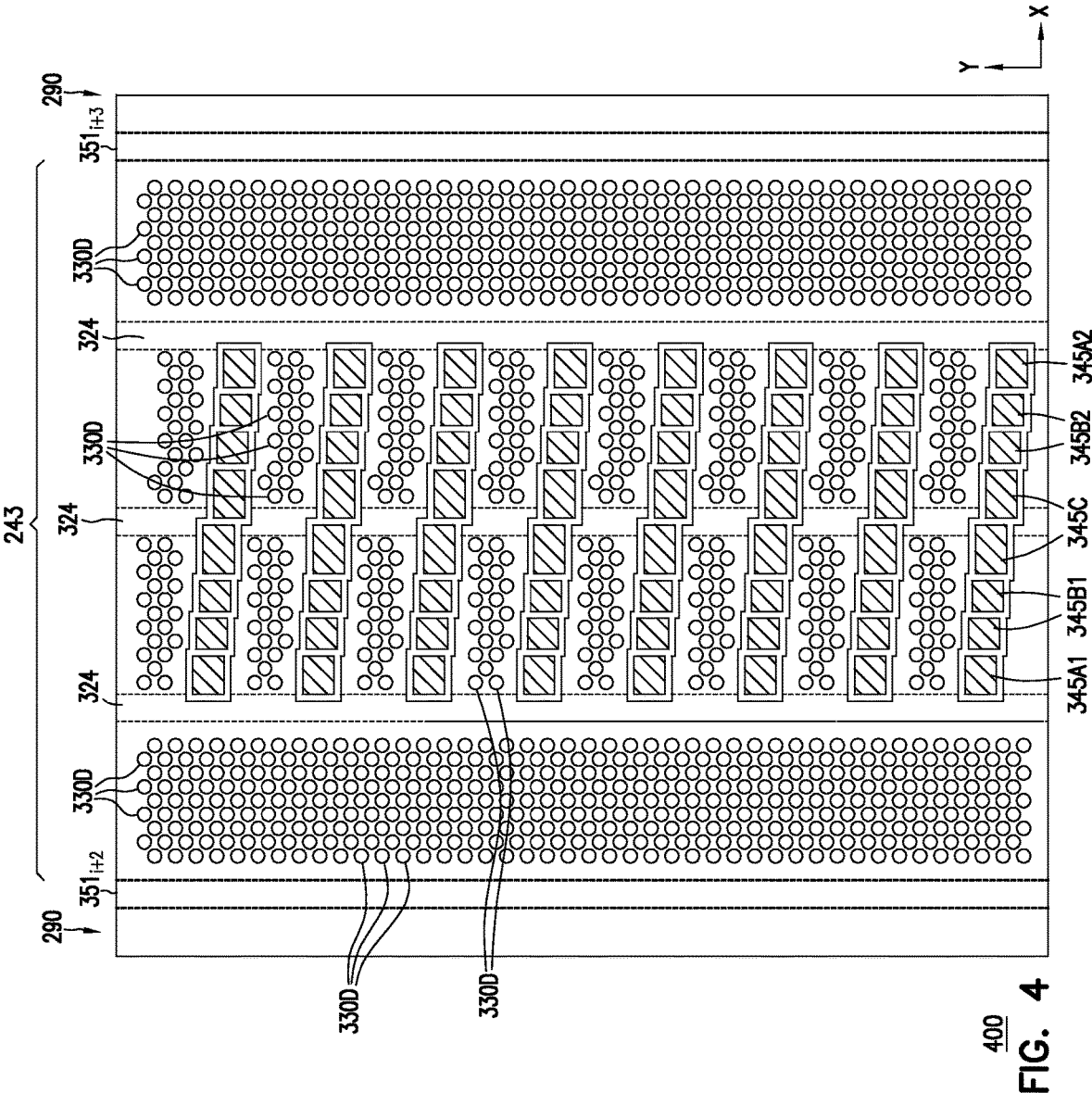
FIG. 4 shows a memory device that can be a variation of the memory device of FIG. 3G and FIG. 3H, according to some embodiments described herein.

FIG. 4 shows a memory device 400 that can be a variation of memory device 200 (FIG. 2 through FIG. 3H), according to some embodiments described herein. For simplicity, descriptions of similar or the same elements between memory devices 200 and 400 are not repeated. Differences between memory devices 200 and 400 include the total number of conductive islands in a group. As shown in FIG. 4, there are eight (instead of 16 in FIG. 3G) conductive islands 345A1, 345A2, 354B1, 345B2, and 345C adjacent each other in a row (e.g., staggered row) the X-direction. Conductive islands 345A1, 345A2, 345B1, 345B2, and 345C can have different widths like conductive islands 345A1, 345A2, 345B1, 345B2, and 345C of FIG. 3G. Memory device 400 can have similar improvements and benefits as memory device 200 described above with reference to FIG. 2 through FIG. 3H.

Figure 5:
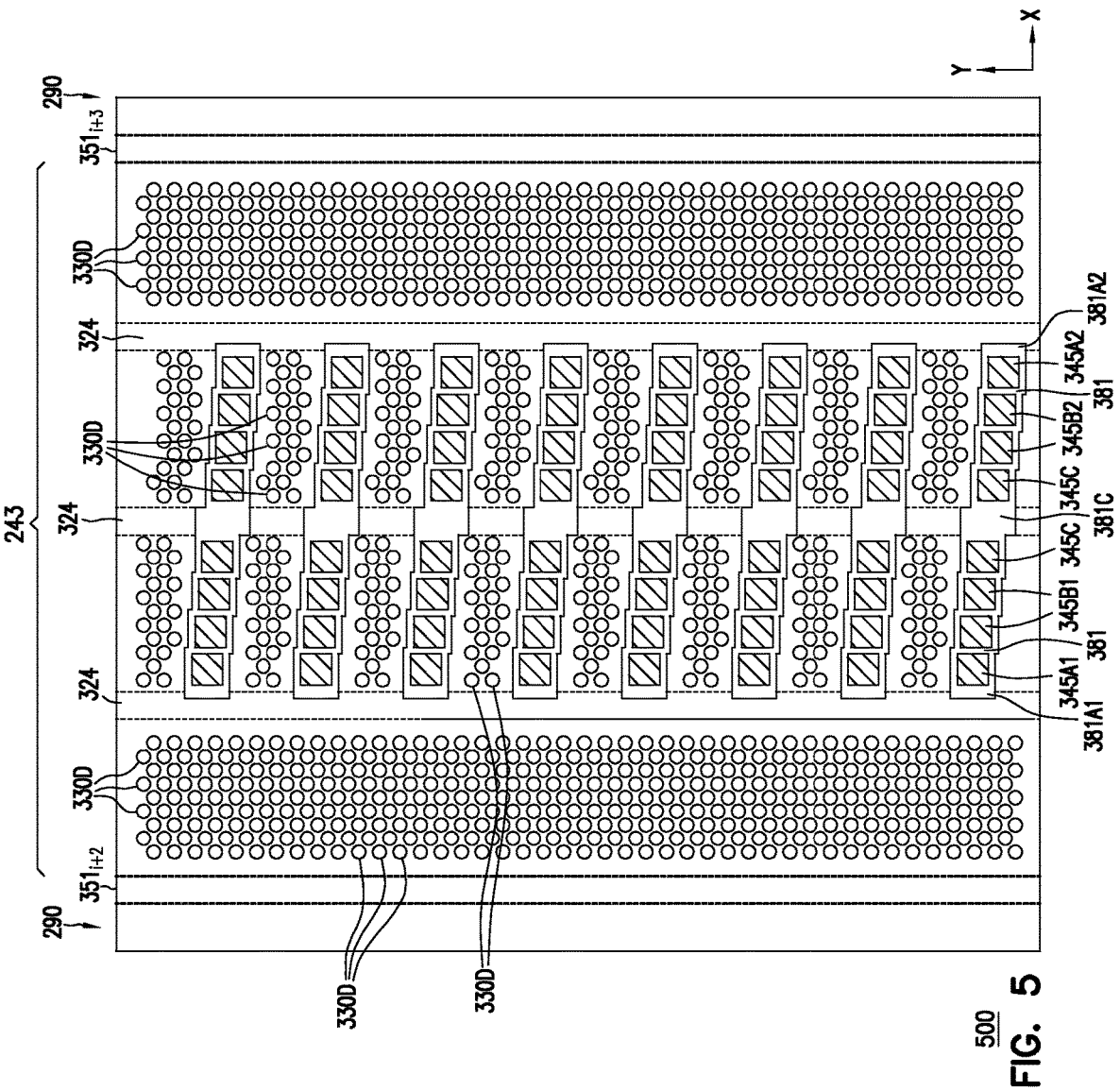
FIG. 5 shows a memory device that can be a variation of the memory device of FIG. 3I and FIG. 3J, according to some embodiments described herein.

FIG. 5 shows a memory device 500 that can be a variation of memory device 200 (FIG. 3I and FIG. 3J), according to some embodiments described herein. For simplicity, descriptions of similar or the same elements between memory devices 200 (FIG. 3I and FIG. 3J) and 500 are not repeated. Differences between memory devices 200 and 500 include the total number of conductive islands in a group. As shown in FIG. 5, there are eight (instead of 16 in FIG. 3G) conductive islands 345A1, 345A2, 345B1, 345B2, and 345C adjacent each other in a row (e.g., staggered row) the X-direction. Conductive islands 345A1, 345A2, 345B1, 345B2, and 345C can have the same widths as conductive islands 345A1, 345A2, 345B1, 345B2, and 345C of FIG. 3I. Dielectric isolators 381, 381A1, 381A2, and 381C can have different widths like dielectric isolators 381, 381A1, 381A2, and 381C of FIG. 3I. Memory device 500 can have similar improvements and benefits as memory device 200 described above with reference to FIG. 3I and FIG. 3J.

The illustrations of apparatuses (e.g., memory devices 100, 200, 400, and 500) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, 400, and 500) or a system (e.g., an electronic item that can include any of memory devices 100, 200, 400, and 500).

Any of the components described above with reference to FIG. 1 through FIG. 5 can be implemented in a number of ways, including simulation via software. Thus, apparatuses (e.g., memory devices 100, 200, 400, and 500), or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The memory devices (e.g., memory devices 100, 200, 400, and 500) described herein may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 5 include apparatuses and methods of forming the apparatuses. One of the apparatuses includes a conductive structure including a first conductive region under first memory cells, a second conductive region under second memory cells, and a third conductive region between the first and second conductive regions; conductive islands adjacent each other and formed in the third conductive region and separated from the third conductive region; dielectric isolators separating the conductive islands from each other, wherein the conductive islands include a conductive island such that a first portion of the conductive islands is located on a first side of the conductive island, and a second portion of the conductive islands is located on a second side of the conductive island; and the width of the conductive island is greater than the width of at least one conductive island in each of the first and second portions of the conductive islands. Other embodiments, including additional apparatuses and methods, are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B, and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B, and C" means A only; B only; or C only. Item A can include a single element or multiple elements. Item B can include a single element or multiple elements. Item C can include a single element or multiple elements.

In the detailed description and the claims, the terms "first," "second," and "third," etc. are used merely as labels, and are not intended to impose numerical requirements on their objects.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:

a conductive structure including a first conductive region under first memory cells, a second conductive region under second memory cells, and a third conductive region between the first and second conductive regions;

conductive islands adjacent each other and formed in the third conductive region and separated from the third conductive region, each of the conductive islands including a width;

dielectric isolators separating the conductive islands from each other, wherein:

the conductive islands include a conductive island such that a first portion of the conductive islands is located on a first side of the conductive island, and a second portion of the conductive islands is located on a second side of the conductive island; and the width of the conductive island is greater than the width of at least one conductive island in the first portion of the conductive islands and at least one conductive island in the second portion of the conductive islands, wherein one of the conductive islands in the first portion of the conductive islands includes a width greater than a width of each of the other conductive islands in the first portion of the conductive islands.

2. The apparatus of claim 1, further comprising;

data lines formed over the first and second memory cells; and conductive pillars extending between the data lines and the conductive islands and coupled to the data lines and the conductive islands.

3. The apparatus of claim 1, wherein one of the conductive islands in the second portion of the conductive islands includes a width greater than a width of each of the other conductive islands in the second portion of the conductive islands.

4. The apparatus of claim 1, wherein the apparatus comprises a memory device, the memory device including circuitry located under the conductive structure and coupled to the conductive islands.

5. An apparatus comprising:

conductive islands adjacent each other and formed in a conductive region and separated from the conductive region, each of the conductive islands including a width;

dielectric isolators separating the conductive islands from each other;

data lines for memory cells and formed over the conductive region;

conductive pillars extending between the data lines and the conductive islands and coupled to the data lines and the conductive islands, wherein:

the conductive islands include a pair of conductive islands adjacent each other such that a first portion of the conductive islands is located on a first side of the pair of conductive islands, and a second portion of the conductive islands is located on a second side of the pair of conductive islands;

the width of each conductive island of the pair of conductive islands is greater than the width of each conductive island in the first and second portions of the conductive islands:

the conductive region is part of a conductive structure, the conductive structure including a first additional region formed under a first portion of the memory cells, and a second additional region formed under a second portion of the memory cells, wherein the conductive region is between the first and second additional regions;

the first portion of the memory cells are included in a first memory block, and the second portion of the memory cells are included in a second memory cell memory block; and the data lines are shared by the first and second memory cell blocks.

6. The apparatus of claim 5, wherein one of the conductive islands in the first portion of the conductive islands includes a width greater than a width of each of the other conductive islands in the first portion of the conductive islands.

7. The apparatus of claim 6, wherein one of the conductive islands in the second portion of the conductive islands includes a width greater than a width of each of the other conductive islands in the second portion of the conductive islands.

8. An apparatus comprising:

a conductive structure including a first conductive region under first memory cells, a second conductive region under second memory cells, and a third conductive region between the first and second conductive regions;

first conductive islands adjacent each other and formed in a first location of the third conductive region and separated from the third conductive region, the first conductive islands separated from each other by first dielectric isolators, each of the first conductive islands including a width, wherein the width of two of the first conductive islands is greater than the width of each of the other first conductive islands;

second conductive islands adjacent each other and formed in a second location of the third conductive region and separated from the third conductive region, the second conductive islands separated from each other by second dielectric isolators, each of the second conductive islands including a width, wherein the width of two of the second conductive islands is greater than the width of each of the other second conductive islands;

third conductive islands adjacent each other and formed in a third location of the third conductive region and separated from the third conductive region, the third conductive islands separated from each other by third dielectric isolators, each of the third conductive islands including a width, wherein the width of two of the third conductive islands is greater than the width of each of the other third conductive islands;

fourth conductive islands adjacent each other and formed in a fourth location of the third conductive region and separated from the third conductive region, the fourth conductive islands separated from each other by fourth dielectric isolators, each of the fourth conductive islands including a width, wherein the width of two of the fourth conductive islands is greater than the width
of each of the other fourth conductive islands, wherein:
the third conductive region includes a first conductive
portion between the first and third locations, a second
conductive portion between the second and fourth
locations, and a third conductive portion between the
first and second conductive portions and in electrical
contact with the first and second conductive portions.

9. The apparatus of claim 8, wherein a total number of
each of the first, second, third, and fourth conductive islands
is an even number.

10. The apparatus of claim 8, further comprising:
first dummy memory cells over the first conductive por-
tion; and
second dummy memory cells over the second conductive
portion.

11. The apparatus of claim 8, further comprising data lines
over the conductive structure and coupled to the first,
second, third, and fourth conductive islands.

12. An apparatus comprising:
a conductive structure including a first conductive region
under first memory cells, a second conductive region
under second memory cells, and a third conductive
region between the first and second conductive regions;
conductive islands adjacent each other and formed in the
third conductive region and separated from the third
conductive region; and
dielectric isolators separating the conductive islands from
each other, each of the dielectric isolators including a
width, wherein the width of one of the dielectric
isolators is at least one and a half times greater than the
width of each remaining dielectric isolator among the
dielectric isolator, wherein:
the dielectric isolators include a dielectric isolator such
that a first one-half of a total number of the conductive
islands is located on a first side of the dielectric isolator,
a second one-half of the total number of the conductive
islands is located on a second side of the dielectric
isolator; and
the dielectric isolator has a width at least two times greater
than the width of each dielectric isolator between
adjacent conductive islands of each of the first one-half
and the second one-half of the total number of the
conductive islands.

13. The apparatus of claim 12, wherein a total number of
the conductive islands is an even number.

14. The apparatus of claim 12, wherein a total number of
the dielectric isolators is an odd number.

15. The apparatus of claim 12, further comprising data
lines over the first memory cells and coupled to the con-
ductive islands.

16. The apparatus of claim 12, wherein the dielectric
isolators include:
first dielectric isolators separating the conductive islands
on the first side of the dielectric isolator from each
other;
second dielectric isolators separating the conductive
islands on the second side of the dielectric isolator from
each other; and
one of the first dielectric isolators includes a width greater
than a width of each dielectric isolator of a remaining
portion of the first dielectric isolators.

17. The apparatus of claim 16, wherein one of the second
dielectric isolators includes a width greater than a width of
each dielectric isolator of a remaining portion of the second
dielectric isolators.

18. An apparatus comprising:
a conductive structure including a first conductive region
under first memory cells, a second conductive region
under second memory cells, and a third conductive
region between the first and second conductive regions;
first conductive islands adjacent each other and formed in
a first location of the third conductive region and
separated from the third conductive region;
first dielectric isolators separating the conductive islands
from each other, each of the dielectric isolators includ-
ing a width, wherein the width of one of the first
dielectric isolators is at least two times greater than the
width of each of the other first dielectric isolators;
second conductive islands adjacent each other and formed
in a second location of the third conductive region and
separated from the third conductive region, the second
location adjacent the first location in a first direction;
second dielectric isolators separating the second conduc-
tive islands from each other, each of the second dielec-
tric isolators including a width, wherein the width of
one of the second dielectric isolators is at least two
times greater than the width of each of the other second
dielectric isolators;
third conductive islands adjacent each other and formed in
a third location of the third conductive region and
separated from the third conductive region, the third
location adjacent the first location in a second direction;
third dielectric isolators separating the third conductive
islands from each other, each of the third dielectric
isolators including a width, wherein the width of one of
the third dielectric isolators is at least two times greater
than the width of each of the other the third dielectric
isolators;
fourth conductive islands adjacent each other and formed
in the third conductive region and separated from the
third conductive region, the fourth location adjacent the
third location in the first direction;
fourth dielectric isolators separating the conductive
islands from each other, each of the dielectric isolators
including a width, wherein the width of one of the
fourth dielectric isolators is at least two times greater
than the width of each of the other fourth dielectric
isolators, wherein:
the third conductive region includes a first conductive
portion between the first and third locations, a second
conductive portion between the second and fourth
locations, and a third conductive portion between the
first and second conductive portions and in electrical
contact with the first and second conductive portions.

19. The apparatus of claim 18, wherein a total number of
each of the first, second, third, and fourth dielectric isolators
is an odd number.

20. The apparatus of claim 18, further comprising:
first dummy memory cells over the first conductive por-
tion; and
second dummy memory cells over the second conductive
portion.

21. The apparatus of claim 18, further comprising data
lines over the conductive structure and coupled to the first,
second, third, and fourth conductive islands.

* * * * *